United States Patent [19]

Labreche et al.

[11] Patent Number: 5,592,131
[45] Date of Patent: Jan. 7, 1997

[54] SYSTEM AND METHOD FOR MODULATING A CARRIER FREQUENCY

[75] Inventors: Louis Labreche, Montreal; Jean-Pierre Lepage, Beaconsfield, both of Canada

[73] Assignee: Canadian Space Agency, Saint-Hubert, Canada

[21] Appl. No.: 220,215

[22] Filed: Mar. 30, 1994

[30] Foreign Application Priority Data

Jun. 17, 1993 [CA] Canada ..................................... 2098624

[51] Int. Cl.⁶ ............................. H03L 5/00; G01S 13/00
[52] U.S. Cl. .......................... 332/103; 332/106; 342/35; 342/170; 342/175; 455/116
[58] Field of Search ...................... 332/106, 108, 332/117, 119, 100–102, 103, 115, 144, 149; 455/102, 103, 116, 110, 113; 342/35, 170, 175; 331/173, 172

[56] References Cited

U.S. PATENT DOCUMENTS

| | | | |
|---|---|---|---|
| 3,456,202 | 7/1969 | Miyagi | 455/116 X |
| 4,058,769 | 11/1977 | Alderman | 455/116 X |
| 4,727,339 | 2/1988 | Doty, II et al. | 331/173 |
| 5,193,222 | 3/1993 | Sasaki | 455/116 X |

Primary Examiner—David Mis

[57] ABSTRACT

A carrier frequency modulating system and method for producing a modulated carrier frequency is disclosed. The system comprises a carrier frequency signal generator for producing a carrier frequency signal at a carrier frequency at an output thereof. The system further comprises a sequencer for producing a modulation signal at an output thereof. This modulation signal comprises a plurality of modulation signal portions separated by at least one null modulation signal portion having a corresponding time length. The system is provided with a modulator for producing a modulated carrier frequency signal at an output thereof. The modulator has a first input connected to the output of the carrier frequency signal generator for receiving the carrier frequency signal, and has a second input for receiving the modulation signal. The system further comprises a power supply unit for supplying electrical power to the carrier frequency signal generator. The sequencer is connected to the carrier frequency signal generator for controlling the activation thereof and to interrupt the carrier frequency signal generator instead of modulating the null modulation signal portion during the corresponding time length, whereby power consumption of the system is minimized.

42 Claims, 10 Drawing Sheets

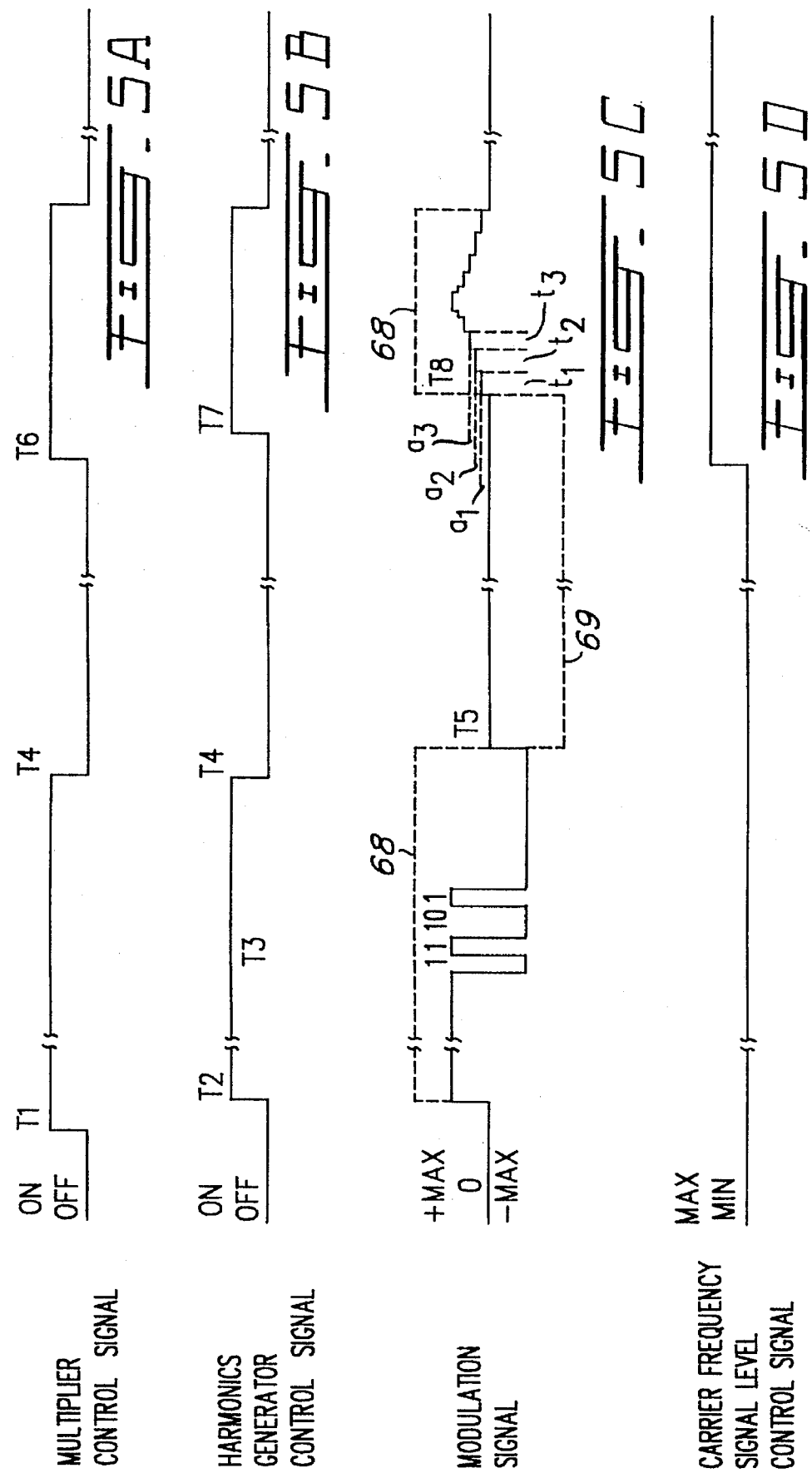

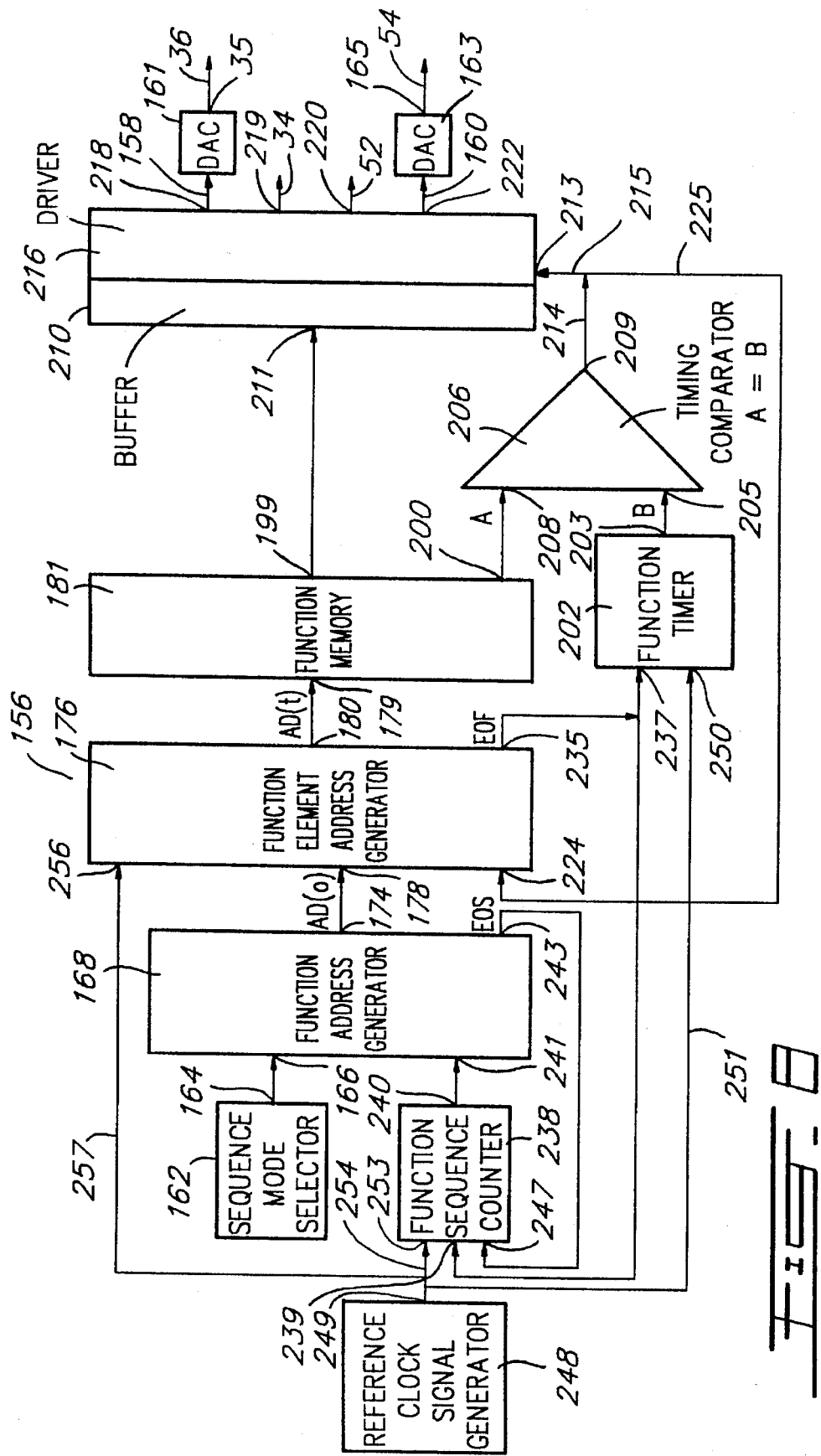

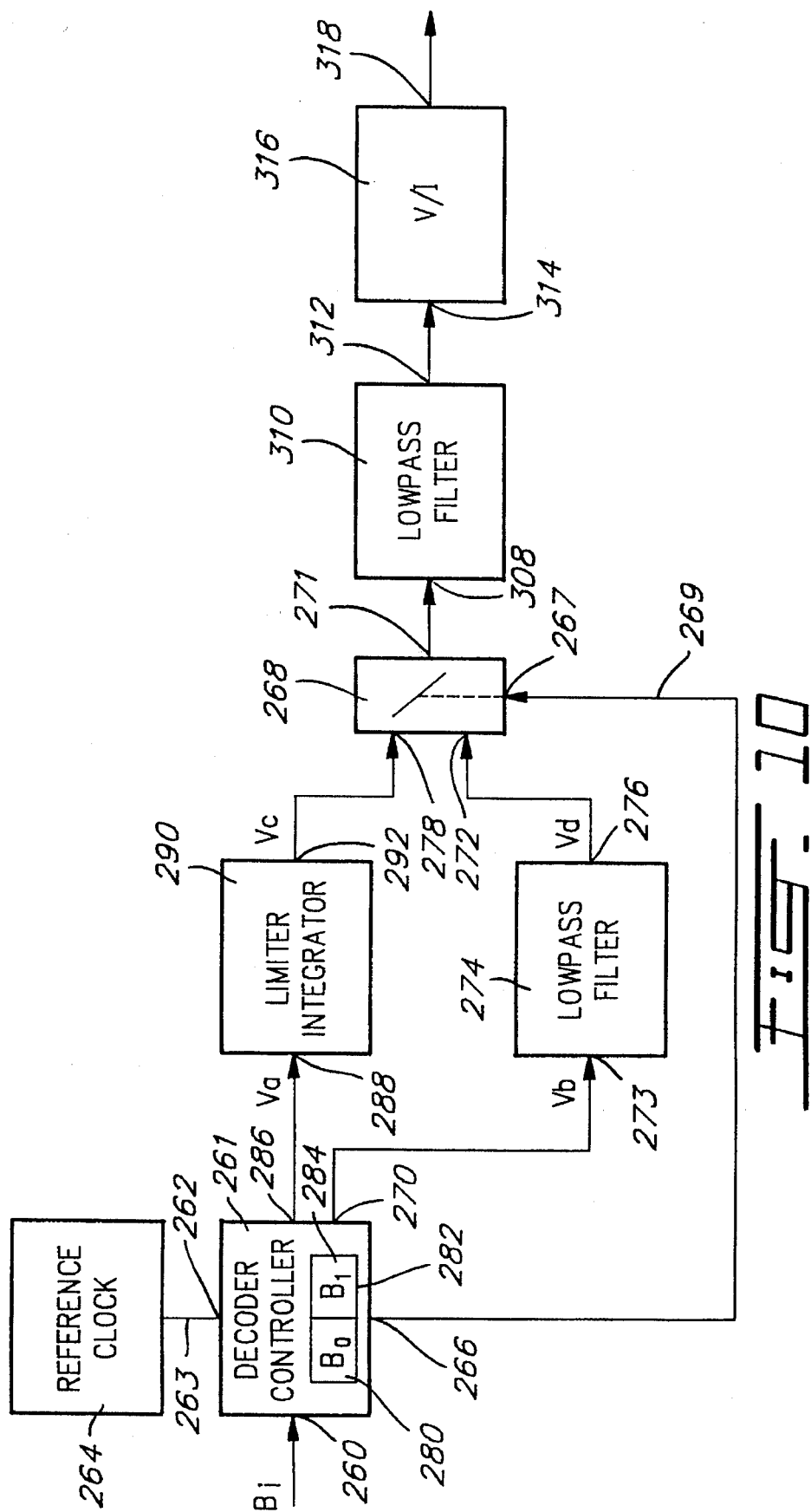

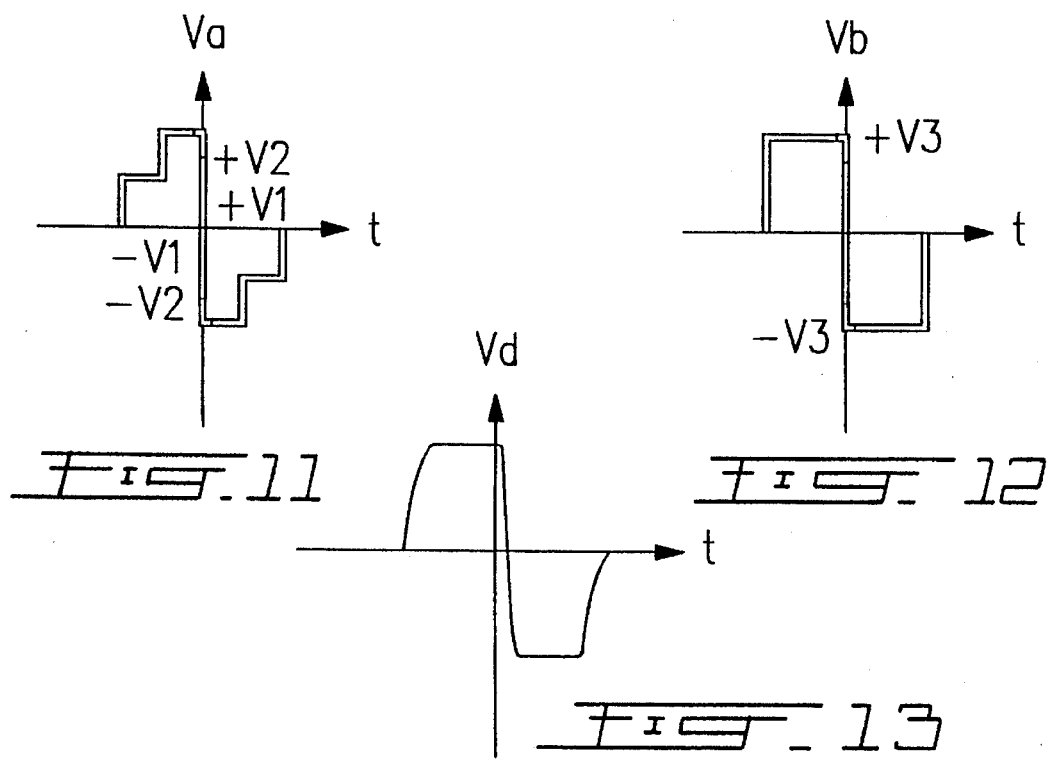
Fig. 11
Fig. 12
Fig. 13
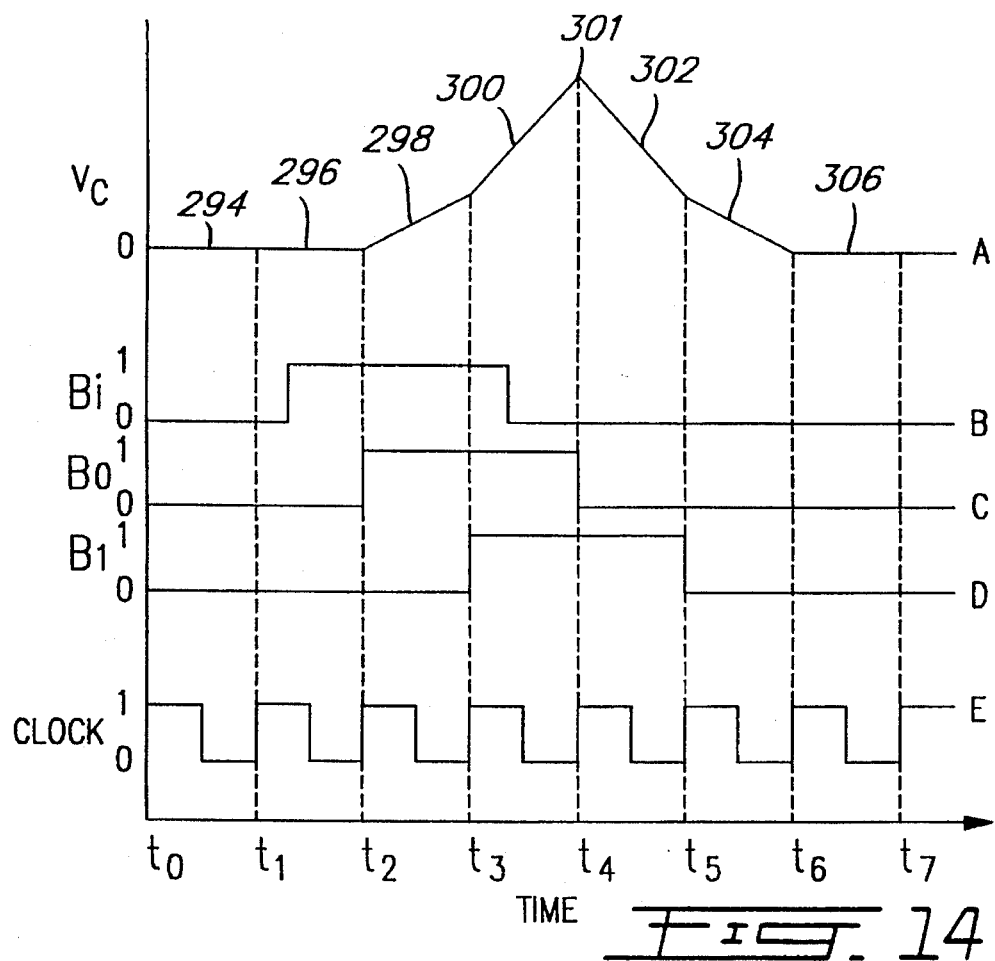
Fig. 14

5,592,131

SYSTEM AND METHOD FOR MODULATING A CARRIER FREQUENCY

BACKGROUND OF INVENTION

1. Field of the Invention

The present invention relates to a system and method for modulating a carrier frequency, and more specifically, to a Microwave Landing System (MLS) modulated carrier frequency generator.

2. Description of Prior Art

In recent years, different techniques for realizing a carrier frequency modulator in a compact circuit have been developed, and particularly for a carrier frequency modulator working at the microwave frequency range. Among these techniques, microwave integrated or hybrid circuits have been proposed in the design of microwave generators or modulators, However, these circuits being generally expensive and complex, there is still a need for a less expensive circuit using simpler technology, such as microstrip circuit manufacturing technique, while presenting high stability and high modulation accuracy characteristics. Moreover, both current integrated or hybrid circuit realizations generally require electric power supply showing a high power output rating, due to the high power dissipation occurring during the operation or these circuits. Especially for portable units operating with battery packs, current generators or carrier frequency modulators using integrated or hybrid circuits cannot feature sufficient low power consumption to provide proper power autonomy while using small battery packs, thereby increasing physical dimensions and weight of such portable units. This low power consumption requirement is of a particular importance for portable MLS generators, which are currently used for ramp testing of airplane inboard MLS receivers.

SUMMARY OF INVENTION

It is thus a feature of the present invention to provide a compact carrier frequency modulating system featuring very low power consumption and presenting a simple and inexpensive design.

Another feature of the present invention is to provide a carrier frequency modulating system featuring high stability and high modulation accuracy characteristics.

Another feature of the present invention is to provide an MLS test signal generator for use in testing MLS receivers.

Another feature of the present invention is to provide an efficient method of modulating a carrier frequency.

According to the above features, from a broad aspect, the present invention provides a carrier frequency modulating system comprising a carrier frequency signal generator for producing a carrier frequency signal at a carrier frequency at an output thereof. The system further comprises a sequencer for producing a modulation signal at an output thereof. This modulation signal comprises a plurality of modulation signal portions separated by at least one null modulation signal portion having a corresponding time length. The system is provided with a modulator for producing a modulated carrier frequency signal at an output thereof. The modulator has a first input connected to the output of the carrier frequency signal generator for receiving the carrier frequency signal, and has a second input for receiving the modulation signal. The system further comprises a power supply unit for supplying electrical power to the carrier frequency signal generator. The sequencer is connected to the carrier frequency signal generator for controlling the activation thereof and to interrupt the carrier frequency signal generator rather than modulating the null modulation signal portion during the corresponding time length.

According to a further broad aspect of the present invention, there is provided a method of modulating a carrier frequency comprising the steps of: (i) producing a carrier frequency signal; (ii) producing a modulation signal comprising a plurality of modulation signal portions separated by at least one null modulation signal portion having a corresponding time length; (iii) modulating the carrier frequency signal according to the plurality of modulation signal portions; and (iv) interrupting said step (i) instead of modulating said at least one null modulation signal portion during said corresponding time length.

BRIEF DESCRIPTION OF DRAWINGS

A preferred embodiment of the present invention will now be described with reference to the accompanying drawings in which:

FIG. 5A is a diagram showing waveform of a multiplier control signal produced by a sequencer as provided by this invention.

FIG. 5B is a diagram showing waveform of a harmonics generator control signal produced by the sequencer as provided by this invention.

FIG. 5C is a diagram showing waveform of a modulation signal produced by the sequencer as provided by this invention.

FIG. 5D is a diagram showing waveform of a carrier frequency signal level control signal produced by the sequencer as provided by this invention.

FIG. 8 is a schematic diagram of the sequencer as proposed by the present invention.

FIG. 10 is a block diagram showing a particular digital to analog converter according to another example of a method for producing an amplitude modulation signal according to the present invention.

FIGS. 11 to 14 are diagrams representing amplitude variation curves with respect to time for various signals produced by the digital to analog converter as shown in FIG. 10.

DESCRIPTION OF PREFERRED EMBODIMENTS

Figure 1:
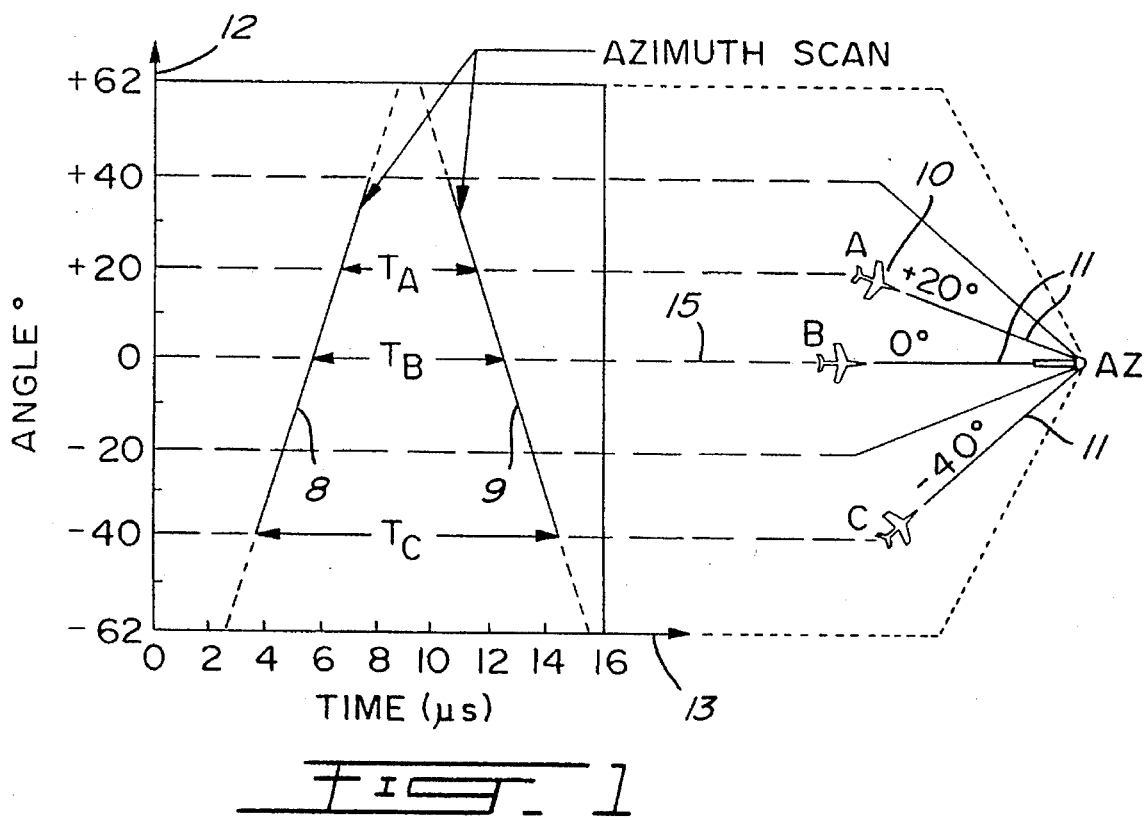
FIG. 1 is a schematic view showing various positions of an airplane with reference to an MLS scanning beam.

Referring to FIG. 1, there are shown three different positions A, B and C of an airplane 10 intersected by an MLS scanning beam 11, with reference to an MLS azimuth scanning range measured in degrees on the axis 12, and to time on axis 13. As well known in the art, second and third scanning ranges can be provided, respectively associated with elevation and back azimuth data. A TO beam scan line 8, and a FROM beam scan line 9 delimit time separations in microseconds between TO and FROM beam centers. In an example as shown in FIG. 1, time separations $t_A$, $t_B$ and $t_C$ respectively correspond to airplane positions A, B and C. According to the following well-known relation:

$$\phi = (T_0 - t) \, V/2$$

Figure 2:
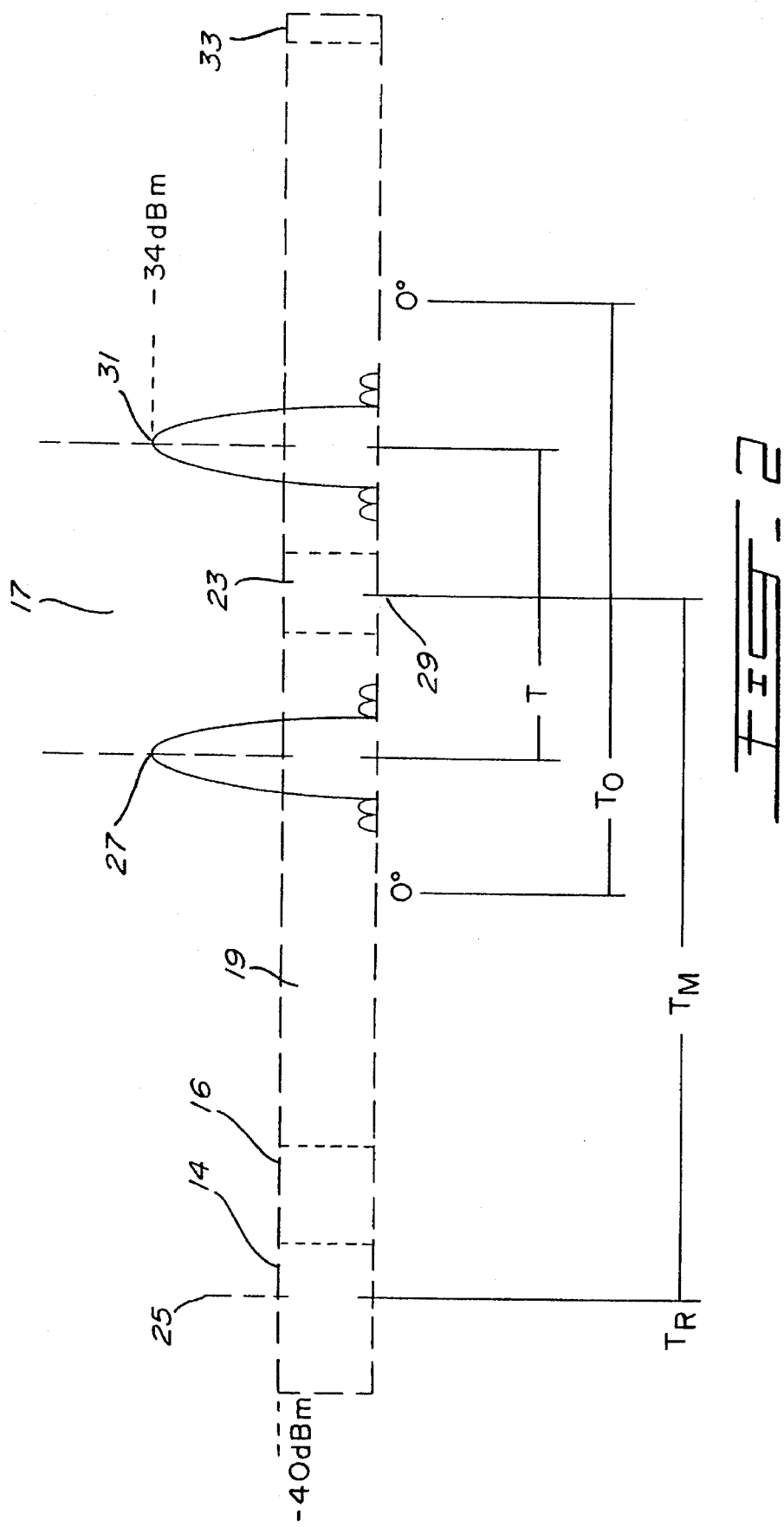
FIG. 2 is a diagram showing a single MLS function comprising a phase modulation data portion followed by an amplitude modulation MLS angle information portion.

Wherein:

$\phi$ is the azimuth or elevation guidance angle in degrees;

t is the time separation in microseconds between TO and FROM beam centers;

$T_0$ is the time separation in microseconds between TO and FROM beam centers corresponding to zero degree;

V is the scan velocity scaling constant in degrees per microsecond; it is therefore possible to derive the accurate position of the airplane 10 with reference to the zero degrees axis 15, as can be also seen with reference to FIG. 2, which shows a single MLS angle function comprising phase modulated data portions 14 and 16, which are followed by an amplitude modulated angle information portion generally designated at numeral 17. As shown in FIG. 2, amplitude level of an MLS phase modulated data signal portion is typically about −40 dBm. The first phase modulated data portion 14 is a preamble data portion comprising MLS function identification data, and defines a reference time 25. The second phase modulated data portion 16 comprises data for scanning sector signals generation. The function is then comprised by a TO scan time slot 19 and a FROM scan time slot 21, which are separated by a pause time 23. At a predetermined time position in the TO scan time slot, which depends on the position of the airplane 10 in the scanning range as shown in FIG. 1, a TO pulse 27 is generated, which corresponds to the intersection of a TO beam moving through the scanning range toward the airplane position. During the pause time slot 23, the beam moving away from the airplane reaches a mid scan point 29, which corresponds to the return of the scanning beam back toward the airplane position. The starting point of a mid scan time separation $T_M$ corresponds to reference time 25. A FROM pulse 31 is then generated, which corresponds to the intersection of a FROM beam moving through the scanning range back to the airplane position. As shown in FIG. 2, amplitude level of an MLS amplitude modulation data signal portion is typically about −34 dBm.

It is pointed out that beam scanning speed is chosen sufficiently high compared to maximum airplane landing speed to render variation of airplane position during time separation t between TO and FROM pulses negligible. FIG. 2 also shows time separation TO between TO and FROM beam centers corresponding to zero degree direction, as designated at position B in FIG. 1. Following the FROM pulse 31, an end of function data portion 33 is finally generated. Other MLS angle functions can be successively generated similarly as hereabove described, which typically have time lengths varying from 3.1 milliseconds to 15.9 milliseconds in an MLS application as provided in a proposed example of the present invention. Furthermore, series of transmitted MLS angle functions can be interleaved with basic or auxiliary data functions giving essential or complementary information which will be subsequently used at the receiver station to derive angle parameters, airplane and landing strip parameters and environmental data. For instance, basic data could consist of scanning range width, landing strip orientation with reference to north, etc., and auxiliary data could provide the ground antenna alignment information. The system as hereunder described is an MLS function generator and carrier frequency modulator which can test an airplane MLS receiver while the airplane is on its ramp, by simulating phase modulated data and amplitude modulated angle information of a transmitted MLS signal, as if it was produced by an MLS ground scanning generator in the direction of an airplane in flight before landing.

Figure 3:
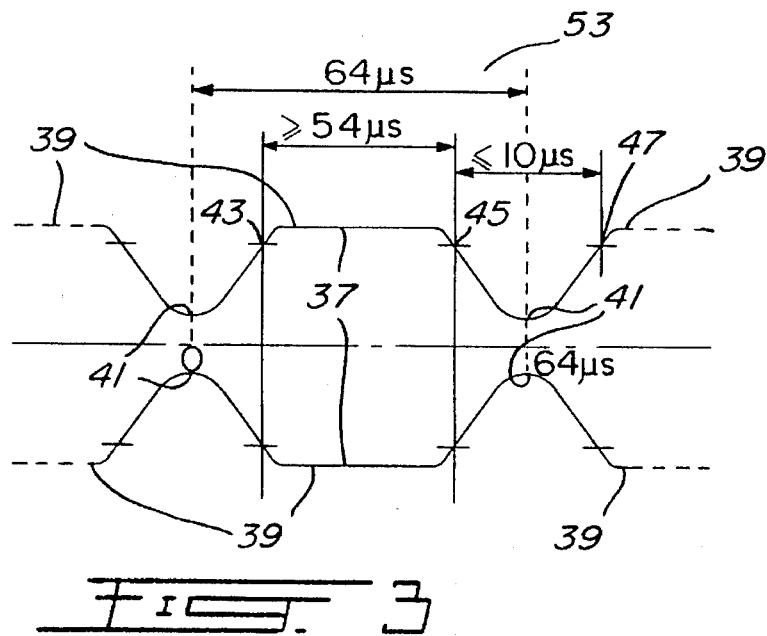
FIG. 3 is a diagram showing the envelope of a typical MLS phase modulated carrier frequency signal produced by an MLS generator as provided by the present invention.

In FIG. 3 there is shown a typical MLS phase modulated carrier frequency signal transmitting coded data on a test channel according to the first phase modulation data sections 14 and 16 of the MLS function as shown in FIG. 2. In the example shown, the waveform envelope, generally designated at numeral 37, comprises a succession of high and low states 39 and 41, the time lengths of which being respectively delimited by 90 percent amplitude points 43, 45 and 47. In a particular example as shown in FIG. 3, the phase modulation is carried out by varying the high state time length between a given minimum value to a maximum value of 54 microseconds, and by varying correspondingly the low state time length between a minimum value of 10 microseconds and a given value depending on high state time length, whereby the cumulative time length of two successive high and low states always totals 64 microseconds, corresponding to a complete cycle as designated at numeral 53. Obviously, other values of high and low states time lengths could be proposed, depending upon the application.

Figure 4:
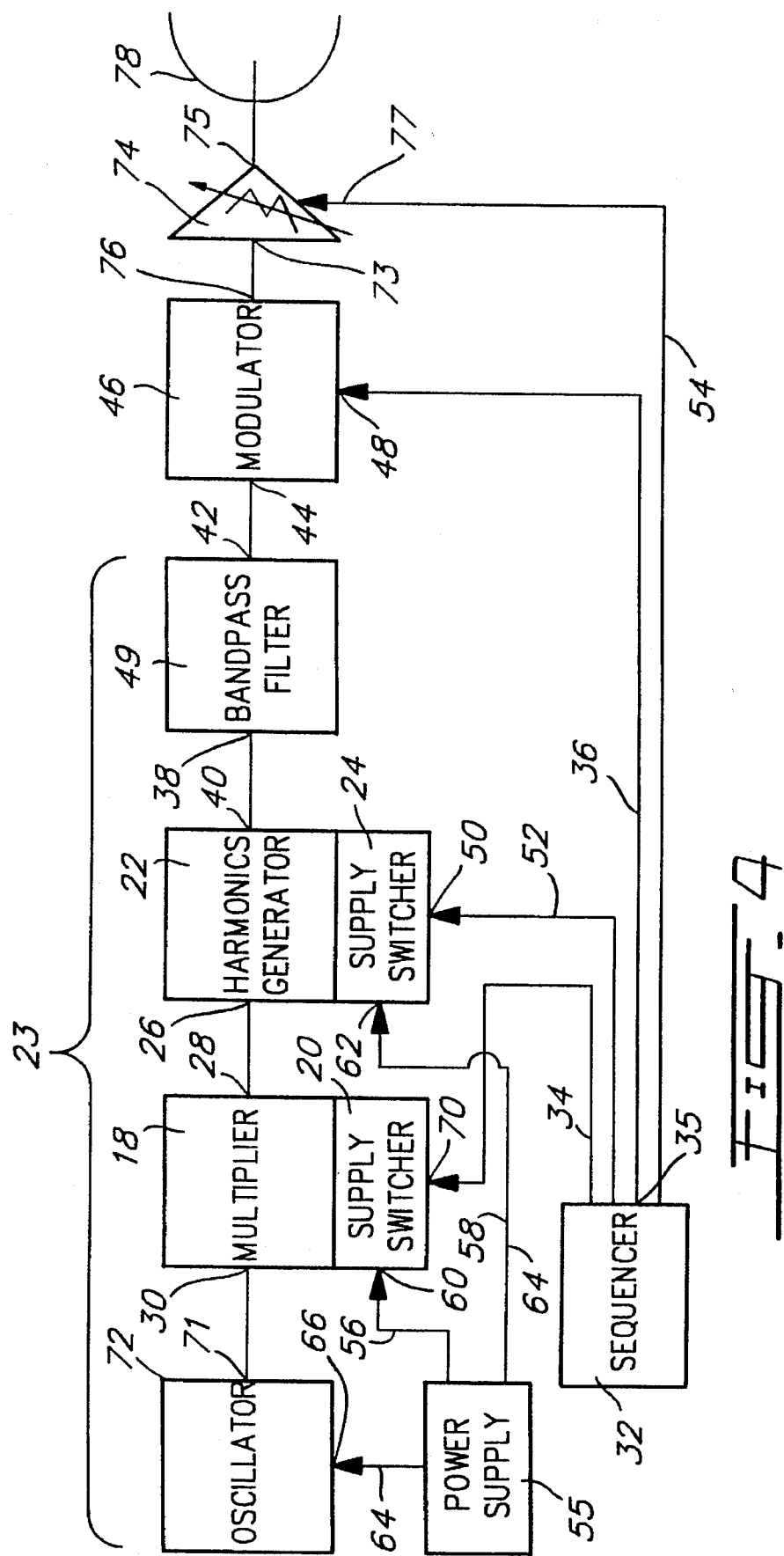
FIG. 4 is a general block diagram of the carrier frequency modulator as provided by the present invention.

Referring now to FIG. 4, the carrier frequency modulator as proposed by the present invention comprises a carrier frequency generator 23 basically consisting of an oscillator 72, a multiplier 18 having a supply switcher 20, and a harmonics generator 22 having a supply switcher 24. A power supply unit 55 supplies electrical power to the multiplier 18 and to the harmonics generator 22 respectively through lines 56 and 58 and supply switchers inputs 60 and 62. The harmonics generator 22 has an input 26 connected to an output 28 provided on the multiplier 18. The multiplier 18 receives from the output 71 of the oscillator 72, which is fed by electrical power from the power supply 55 through line 64 and oscillator input 66, a first signal at a first frequency at an input 30 thereof, and sends to the harmonics generator 22 a signal having a second frequency, which is higher than the frequency of the first signal. In a preferred embodiment of the present invention, the oscillator 72 is a temperature compensated crystal oscillator (TCXO) producing a sinusoidal waveform signal at a first frequency of 43 MHz. The multiplier 18 can be comprised by a pair of triplers connected in series, the combination thereof providing a frequency multiplying factor of 9, thereby producing a sinusoidal waveform signal at a second frequency of 387 MHz. Each tripler could be designed with an amplifier (not shown) used in discontinuous mode followed by bandpass filters (not shown), as well known in the art. Alternatively, the multiplier 18 can be realized with a phase lock loop circuit configuration (not shown), as also well known in the art, the locking time of the oscillator being a critical factor in such a design. Moreover, the multiplier can be omitted through the use as oscillator 72, of a very high frequency TCXO directly supplying the desired sinusoidal waveform signal at 387 MHz.

The harmonics generator 22 then produces at an output 40 thereof higher harmonic frequencies of the second 387 MHz frequency. The carrier frequency generator 23 further comprises a bandpass filter 49 having an input 38 connected to the output 40 of the harmonic generator, to select a substantially narrow frequency band centered at a preselected single harmonic frequency from harmonic frequencies produced by harmonics generator 22, thereby producing a corresponding carrier frequency signal at a carrier frequency at an output 42 provided on said carrier frequency generator 23, which is then directed toward an input 44 of a carrier frequency modulator 46, which will be described later in more detail. In a preferred embodiment of the present invention, the 13th harmonic frequency is selected, which corresponds to a 5031 MHz frequency. Obviously, another harmonic frequency can be selected, depending on the desired carrier frequency. The system is further provided with a sequencer 32, which produces a modulation signal at an output 35 thereof. According to the example as shown in FIG. 4, the sequencer 32 could be provided with an integrated oscillator producing a required clock reference signal. Alternatively, the sequencer 32 could be connected to the output 71 of oscillator 72 to provide the sequencer 32 with a clock reference signal (not shown). A modulation signal is fed to input 48 provided on the modulator 46 through a line 36. Referring to FIG. 5C, there is shown an example of such a modulation signal, which comprises a plurality of modulation signal portions 68 and 68', which are separated by at least one null modulation signal portion 69 having a corresponding time length. The modulation signal portion 68 is used to produce correspondent phase modulated data portions 14 and 16 as illustrated on FIG. 2, and modulation signal portion 68' is used to produce correspondent amplitude modulated angle information portion generally designated at 17 in FIG. 2.

Returning to FIG. 4, the sequencer 32 sends a multiplier control signal to an input 70 of the supply switcher 20 of multiplier 18 through a line 34. In an embodiment of the present invention where the multiplier is omitted by employing a very high frequency TCXO as oscillator 72, the line 34 of sequencer 24 should be connected therewith for transmitting an oscillator control signal to an input of a supply switcher (not shown) coupled to or integrated into the TCXO. Referring to FIG. 5A, there is shown an example of a multiplier control signal comprising successive high and low signal levels, which correspond respectively to "on" and "off" control states for the supply switcher 20 of the multiplier 18. Returning to FIG. 4, the sequencer 32 further sends a harmonics generator control signal to an input 50 of the supply switcher 24 of harmonics generator 22 through a line 52. Referring to FIG. 5B, there is shown an example of a multiplier control signal comprising successive high and low signal levels, which corresponds respectively to "on" and "off" control states for the supply switcher 24 of the harmonics generator 22. The sequencer 32 successively switches supply switchers 20 and 24 for controlling respectively the activation of multiplier 18 and harmonics generator 22 whereby to interrupt multiplier 18 and harmonics generator 22 instead of modulating the null modulation signal portion 69 during a corresponding time length, as shown in FIG. 5C. Returning to FIG. 4, a variable attenuator 74 is provided for receiving at a first input 73 the modulated carrier frequency signal produced at the output 76 of modulator 46, and for adjusting the output level of the modulated carrier frequency signal at a desired level. Referring to FIG. 5D, there is shown an example of a carrier frequency signal level control signal having variable amplitude discretely varying in two or more steps from a given minimum value to a given maximum value. The variable attenuator 74 has a modulated carrier frequency signal output 75 which is connected to a parabolic antenna 78 for transmitting to a receiver (not shown). For carrier frequency modulating applications other than MLS, the modulated carrier frequency output signal could be transmitted to a receiver through a cable line. Now the sequence of production of the modulation and controls signals by the sequencer 32 will be explained with reference to FIGS. 5A, 5B, 5C and 5D. At the beginning of a function transmission sequence, the multiplier control signal is set to the "on" control state at a time T1 as shown in FIG. 5A to switch on the supply switcher 20 causing the activation of the multiplier 18. The harmonics generator control signal is then set to the "on" state at a time T2 as shown in FIG. 5B to switch on the supply switcher 24 causing the activation of the harmonics generator 22. The modulation signal is simultaneously set at a maximum value, which signal, shown in FIG. 5C, is fed to the modulator 46, as shown in FIG. 4. The transmission of digital phase modulation data comprised in the modulation signal then starts at a time T3, or could be preceded by a number of controls data bits for controlling the operation of the digital to analog converter 161, for both phase or amplitude modulation, as will be later explained in more detail with reference to FIGS. 8 and 10. After transmission of the phase modulating data, multiplier and harmonics generator control signals are simultaneously set to the "off" state at a time T4, thereby minimizing power consumption of the system. At a following time T5, the modulation signal is set to a null value corresponding to the beginning of the null modulation signal portion 69. A relatively short period of time before the end of the time length of the null modulation signal portion, at time T6 as shown in FIG. 5A, the multiplier control signal is again set to the "on" state, simultaneously with the activation of the production of the carrier frequency signal level control signal which is set to a given amplitude value between a minimum and a maximum value, as shown in FIG. 5D. The harmonics generator control signal is then again set to the "on" state at a time T7 as shown in FIG. 5B, just before the beginning to the transmission of the amplitude modulation signal portion 68' occurring at time T8, as shown in FIG. 5C. Following function modulation signals can be transmitted in a same manner as hereabove explained.

Figure 6A:
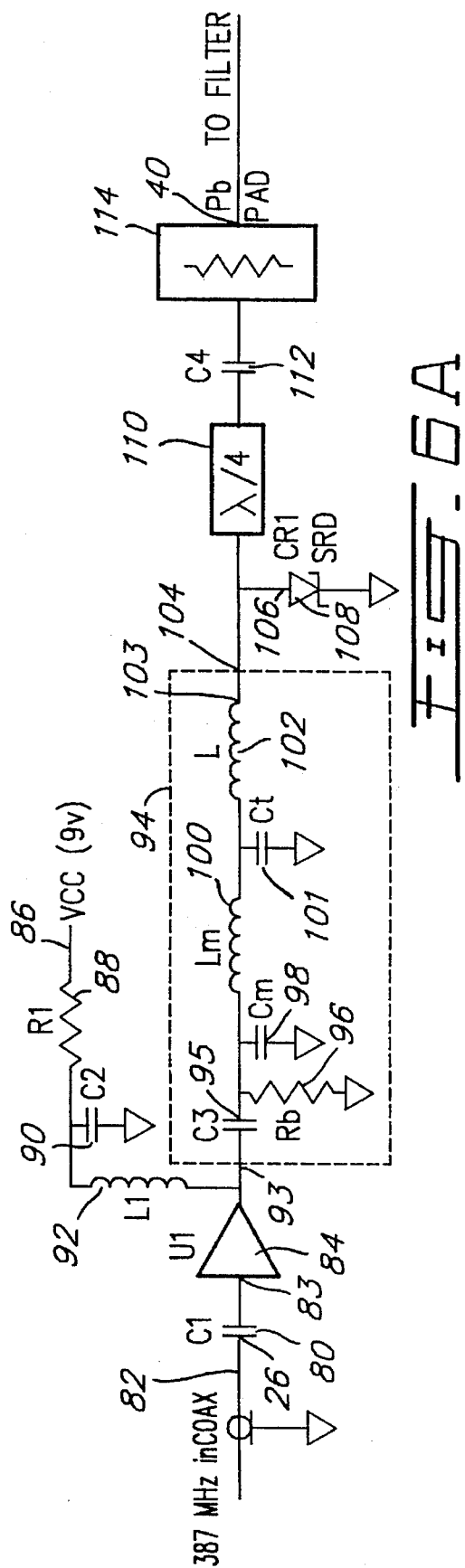
FIG. 6A is an electronic drawing of the generator according to the present invention.
Figure 6B:
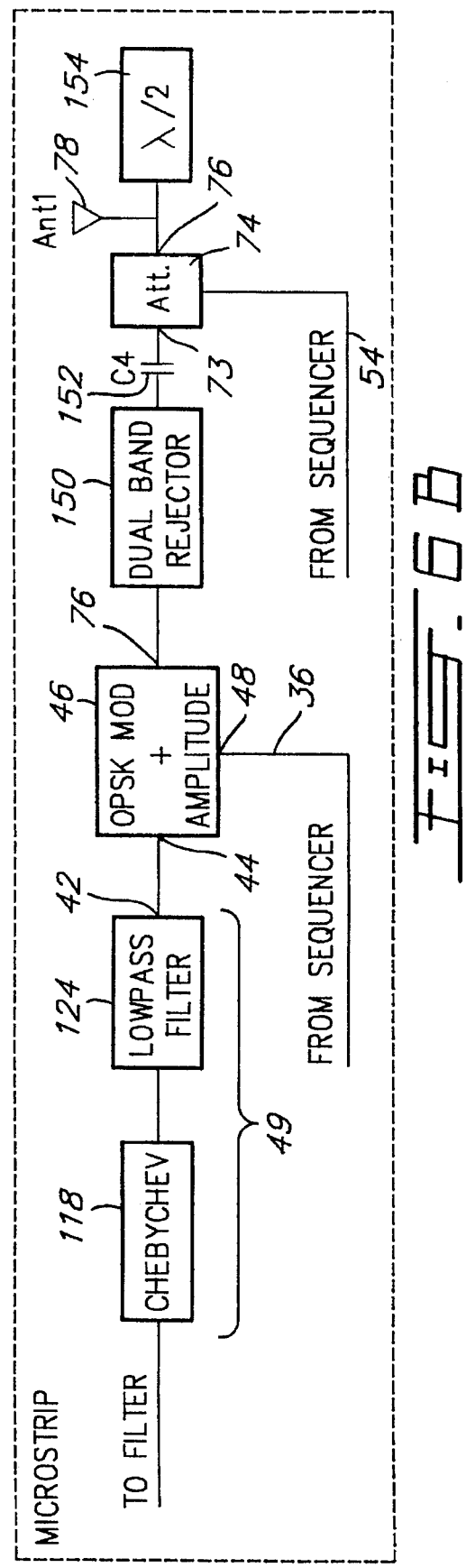
FIG. 6B is a block diagram of the carrier frequency modulator section according to this invention.
Figure 7:
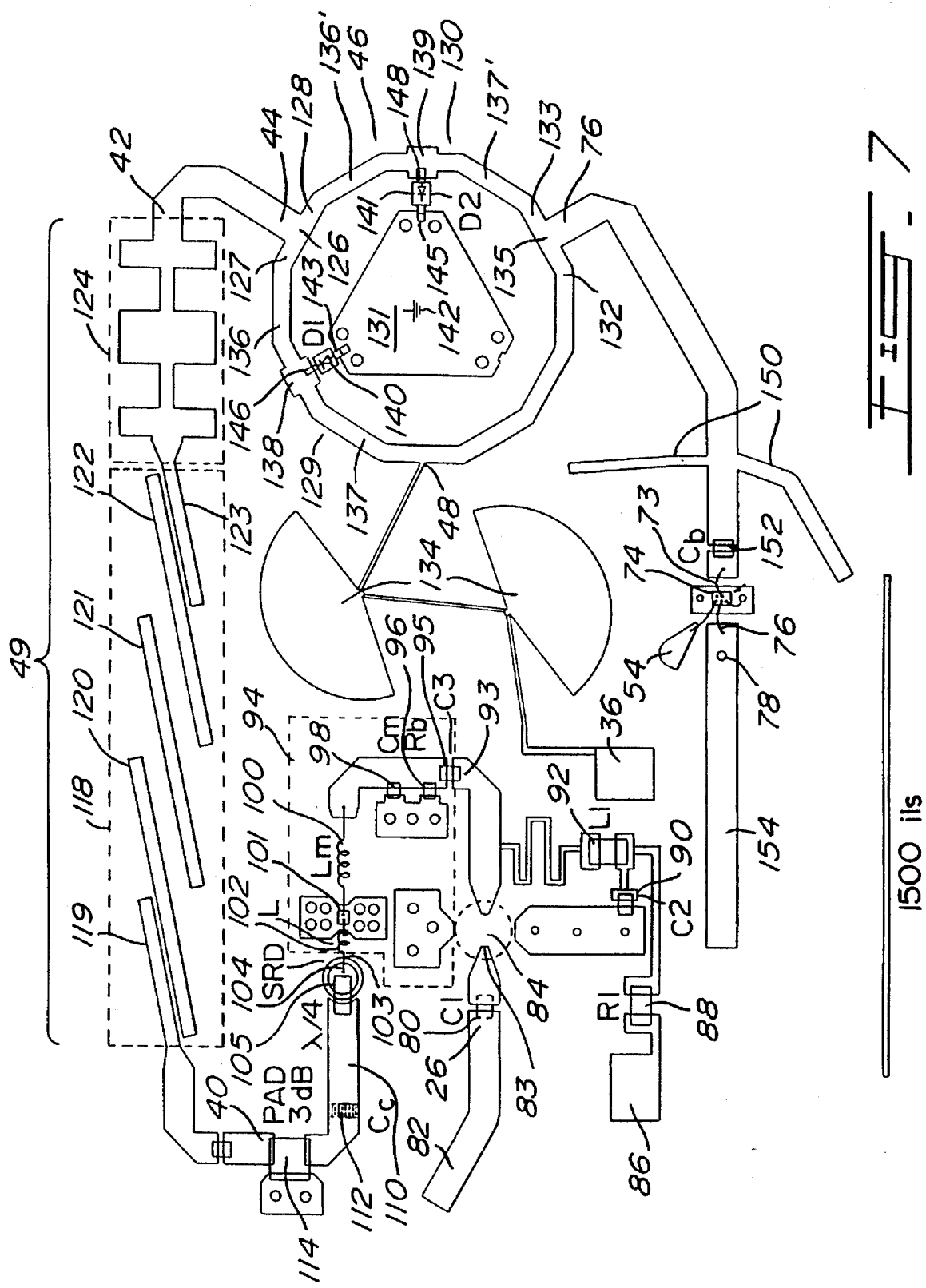
FIG. 7 is a physical representation of the microstrip realization of the carrier frequency generator and carrier frequency modulator according to the present invention.

Referring now to FIGS. 6A and 7, details on the carrier frequency generator and carrier frequency modulator are presented. The second frequency produced at the output of the multiplier, which second frequency is 387 MHz in a particular example shown, is fed at the input 26 to a coupling capacitor 80 through a line 82, which directs the resulting signal to an input 83 of a clipping amplifier 84, which provides a second frequency signal having a stable and sufficient power output level. The harmonics generator control signal from the supply switcher 24 is fed to an input 86 of a coupling circuit which comprises a resistor 88 at the output of which are connected in parallel a grounded capacitor 90 and an inductance 92 feeding a proper harmonics generator control signal to the input 93 of an impedance matching circuit 94, which comprises a coupling capacitor to the output of which are first connected in parallel a resistor 96 and a first grounded capacitor 98 and secondly connected in series a first inductance 100. An output of inductance 100 is first connected to a second capacitor 101 and secondly connected to a second inductance 102 having an output 103 connected to an output 104 of the impedance matching circuit 94. The output 104 is connected to the negative terminal 106 of a step recovery diode 108, whereby the impedance matching circuit 94 provides maximum energy transfer between clipping amplifier 84 and step recovery diode 108. Whenever the step recovery diode is polarized in an inverted conduction state by the second frequency signal coming from multiplier 18, very short duration series of pulses are produced at the terminal 106 of the step recovery diode, which series correspond to a plurality of rates associated with harmonic frequencies of the basic second frequency. The pulses of a given series have time lengths substantially equal to half the period of the corresponding desired harmonic frequency. The pulses are then prefiltered by a quarter of wavelength bandpass filter 110 tuned at the desired harmonic carrier frequency, which is followed by a coupling capacitor in series with an attenuator 114 for impedance matching purposes with a following carrier frequency modulator section of the circuit, as shown in FIGS. 6B and 7. A bandpass filter section 49 comprises a bandpass filter 118 and a lowpass filter 124. The bandpass filter 118 selects a substantially narrow frequency band centered at a single harmonic frequency from harmonic frequencies of the pulsed signal as produced at the output 40 of attenuator 114. In a preferred embodiment of the present invention, the 13th harmonic of the pulsed signal is selected by the filter 118, which is a 4th order Chebychev bandpass filter comprising a series of coupled resonating parallel transmission lines 119, 120, 121, 122, and 123, in an example as shown in FIG. 7. The bandwidth of the bandpass filter 118 is compatible with harmonic frequencies separation and with filter temperature stability as required by the system. The produced filtered pulsed signal is then fed to a lowpass filter 124, as shown in FIGS. 6B and 7, which has a cutoff frequency higher than the selected single harmonic frequency and being in a range near thereto, whereby to produce, at an output 42, a carrier frequency signal substantially free of interference harmonic frequencies generated by the bandpass filter 118. A modulator 46 has a first input 44 for receiving the carrier frequency signal, and a second input 48 for receiving phase and amplitude modulation signals coming from the sequencer through the line 36 as better shown in FIG. 4. Carrier frequency decoupling devices 134 are connected to the line 36 ahead of input 48, for preventing the carrier frequency signal from reaching sequencer through the line 36 (see FIG. 7). A preferred embodiment of the present invention provides a modulator 46 comprising a "rat race" type phase modulating circuit having a first connecting node 126 connecting the carrier frequency signal input 44 to respective inputs 127 and 128 of first and second conducting paths 129 and 130 having a difference in length substantially equal to half a wavelength corresponding to the carrier signal frequency. Conducting paths 129 and 130 have respective outputs 132 and 133 being connected to the output of the modulator 46 at a second connecting node 135. The modulator further comprises a switching device 131 connected to the modulation signal input 48, and connected to the conducting paths 129 and 130 to successively activate only one conducting path at a time, whereby to produce, by switching between a positive maximum amplitude and a negative maximum amplitude, the phase modulated carrier frequency portion of the modulated carrier frequency characterized by a required 180 degrees shift provided by the half a wavelength paths difference, and to produce in a single polarity mode the amplitude carrier frequency portion of the modulated carrier frequency. In an example of the present invention as shown in FIG. 7, the modulator 46 is a phase shift keying (PSK) modulator designed and properly fed to provide a DPSK (differential phase shift keying) modulation as required by an MLS receiver system. However, it is within the ambit of the present invention to provide other types of modulation as PSK, QPSK, BPSK, M-PSK, FM or FSK, implying the use of proper carrier frequency modulator circuits which can be readily proposed by a person skilled in the art. For the carrier frequency amplitude modulation, the amplitude of the modulation carrier frequency signal is varied between a substantially null value and a maximum value, for either a positive or negative polarity. For a null modulation amplitude signal value, both paths 129 and 130 are open, and a substantially null output signal is obtained (about −20 dBm) using a properly balanced modulator, since signals propagating on respective paths 129 and 130 are mutually cancelled. Each of conducting paths 129 and 130 comprises first and second portions 136, 137 and 136' 137' connected respectively by third and fourth nodes 138 and 139 which are spaced from the first node 126 by a distance substantially equal to half a wavelength corresponding to the carrier frequency. The second portion 137 of the first conducting path 129 has a length separating the third node 138 from the second node 135 by a distance substantially equal to three quarter a wavelength corresponding to the carrier frequency. The second portion 137' of the second conducting path 130 has a length separating the fourth node 139 from the second node 135 by a distance substantially equal to half a wavelength corresponding to the carrier frequency. In this way, the required half a wavelength difference in length between conducting paths is provided. The switching device 131 is connected to the first and the second conducting paths respectively at third and fourth nodes 138 and 139. The switching device 131 comprises first and second diodes 140 and 141 having opposed polarity terminals 143 and 145 being connected to the input 48 for receiving the modulation signal, and being connected to a ground 142 of the system. Each terminal of a second pair of opposed polarity terminals 146 and 148 are respectively connected to the third and fourth connecting nodes 138 and 139. In this way, the carrier frequency signal traverses the first conducting path 129 whenever second diode 141 is caused to conduct by the modulation signal, and the carrier frequency signal traverses the second conducting path 130 whenever the first diode 140 is caused to conduct by the modulation signal. For the carrier frequency amplitude modulation, it is pointed out that having the response curve of the modulator 46 characterizing the output power thereof in terms of amplitude, a desired pulse waveform can be produced by selecting appropriate amplitudes, and knowing the temperature behavior of diodes, the sequencer can be programmed to vary the amplitude of said amplitude modulation signal in successive increasing or decreasing predetermined steps separated by predetermined time periods, as illustrated in FIG. 5C with reference to time periods $t_1$, $t_2$, $t_3$, etc. respectively corresponding to amplitudes $a_1$, $a_2$, $a_3$, etc. Since the harmonics generator control signal is set to the "on" state at a time T7 just before the beginning to the transmission of the amplitude modulation signal portion 68' occurring at time T8, as earlier explained with reference to FIGS. 5B and 5C, it is possible to produce a first main basic amplitude portion on which either amplitude portions $a_1$, $a_2$, $a_3$, etc. are added to produce the required amplitude modulation signal. Temperature compensation of the modulator 46 is carried out by controlling current circulating in diodes 140 and 141 with a temperature sensitive thermistor circuit (not shown). The modulated carrier frequency signal produced at an output 76 of the modulator 46 is directed to an optional second bandpass filter 150 acting as a dual band rejector, to attenuate frequencies adjacent the carrier frequency. The resulting single frequency modulated carrier frequency signal is then directed to the input 73 of a variable attenuator 74, through a coupling capacitor 152, the variable attenuator 74 receiving at a second input 77 a carrier frequency signal level control signal from the sequencer through a line 54, as earlier explained with reference to FIG. 4. Such a variable attenuator can be realized using diodes switching between a direct path and an attenuated path whose attenuation can be adjusted to one of predetermined levels. Alternatively, a variable attenuator can be realized using FET transistors mounted in a T or $\pi$ configuration, on which a gate modulated voltage is applied to obtain the desired attenuation level. The filtered modulated carrier frequency signal produced at the variable attenuator output 76 is connected to a parabolic antenna 78 as shown in FIG. 6B, for transmitting to a receiver (not shown). Finally, a tunable impedance matching line 154 is connected to the terminal of the antenna 78, which matching line has a length corresponding to approximately half a wavelength of the carrier frequency.

Referring now to FIG. 8, an example of a sequencer according to the present invention is illustrated, wherein this sequencer comprises a digital generator, generally designated at numeral 156, for producing a digital modulation signal through a line 158, control signals for the carrier frequency signal generator 23 through lines 34 and 52, and carrier frequency signal level digital control signal through a line 160. The sequencer is further provided with a first digital to analog converter 161 to produce a corresponding analog modulation signal at an output 35, which signal is directed toward the modulator input 48 through the line 36, as better shown in FIG. 4. When a stepped amplitude modulation signal as earlier described in reference with FIG. 5C is wanted, the digital to analog converter 161 produces an analog signal showing successive amplitude levels as coded in groups of data bits contained in function elements, as will be later explained.

Turning now to FIG. 10, there is illustrated a particular digital to analog converter which can be used for carrying out another method for producing the amplitude modulation portion of the modulation signal according to the present invention, which method consists in applying a variable slope delta modulation technique. This particular device can be connected in the same way as the digital to analog converter 161 as shown in FIG. 8. Referring to graph A of FIG. 14, there is graphically represented an approximation of a desired modulation signal waveform envelope, which signal after proper lowpass filtering and voltage to current converting, is fed to the modulator, as earlier explained with reference to FIG. 4. In a particular instance as shown in graph A of FIG. 14, the waveform has been chosen in such a manner to obtain, after lowpass filtering and modulation, an amplitude modulated signal which is a fair approximation of a real MLS amplitude modulated signal, as shown in FIG. 2. Therefore, in predetermining the waveform characteristics through proper sequencer encoding, one should consider transfer functions of lowpass filter and modulator section.

Turning now to FIG. 10, a first bit $B_i$ of a properly encoded serial digital bits string signal, coming from the sequencer driver 216 as shown in FIG. 8, is fed to an input 260 of a decoder/controller 261, which has a second input 262 for receiving a reference clock signal, as shown in graph E of FIG. 14, from a reference clock 264 through a line 263, which reference clock 264 is preferably synchronized with the reference clock signal generator 248 as shown in FIG. 8. The decoder/controller receives and decodes the control data bits provided simultaneously with the modulation data bits, as earlier described with reference to FIG. 5C, to produce at a second output 266 thereof a corresponding control signal transmitted to a control input 267 of a port selector 268 through a line 269. In the example as shown in FIG. 10, the control data bits code indicates to the decoder/controller 261 the kind of modulation characterizing the incoming modulation bits string, either phase modulation or amplitude modulation. Whenever a phase modulation code is detected by the decoder/controller 261, the latter sends a control signal to the port selector 268 through the line 269, which causes the selector to connect an output 271 thereof with a first port 272 thereof. The decoder/controller 261 then produces at a third output 270 thereof a phase modulation signal $V_b$, whose amplitude should take one of two amplitudes values, say $+V_3$ or $-V_3$, as shown in FIG. 12, which shows only two cycles comprised in the modulation signal portion of a modulation signal as shown in FIG. 5C. This phase modulation signal $V_b$ is fed to an input 273 of a second lowpass filter 274, which extends rise and fall times of the incoming phase modulation signal $V_b$ to produce a filtered phase modulation signal $V_d$ at an output 276 thereof, which signal has a waveform as shown in FIG. 13. This signal then exits the selector 268 through its output 271. Whenever an amplitude modulation code is detected by the decoder/controller, the latter sends a control signal to the port selector 268 through the line 269, which causes the selector to connect its output 271 with a second port 278 thereof. At a following clock pulse the value of a first modulation data bit $B_i$ of the amplitude modulation bits string is stored in a first memory cell 280 of a shift register 282 provided in the detector/controller 261, associating this value to a first shift register bit $B_0$, immediately after a current prior value of $B_0$ has been transferred to a second memory cell 284, associating this value to a second shift register bit $B_1$. Therefore, the value previously stored in the memory cell 284 is lost, being replaced by the prior value of $B_0$. Such a process is successively repeated, until the last bit of the transmitted modulation bits string is stored in the shift register. An example of two bits sequential coding will be hereunder explained with reference to the following TABLE I:

| $B_0$ | $B_1$ | Polarity | Slope Amplitude |
|---|---|---|---|
| 0 | 0 | − | $A_1$ |
| 1 | 0 | + | $A_1$ |
| 1 | 1 | + | $A_2$ |
| 0 | 1 | − | $A_2$ |

TABLE I gives sampled pairs of bits values which are chosen to correspond respectively to the different control states characterized by a given polarity (+ or −) and a given slope amplitude value selected from two predetermined amplitude values in an example using two bits coding. Obviously, in order to build a desired waveform with more accuracy, more than two predetermined amplitude values could be selected, by using three or more bits for the sample coding. Conversely, one can propose to use a single bit sample coding in such cases when a single slope amplitude value yields acceptable results. Returning to FIG. 10, it is pointed out that depending upon the values of the sampled pair of bits $B_0$ and $B_1$ as currently stored in shift register memory cells 280 and 284, the logic decoder/controller produces a pre integration signal $V_a$ characterizing the current polarity and slope values as determined by current $B_0$ and $B_1$ values, the signal $V_a$ having an amplitude which should take one of four amplitudes values, say $+V_2$, $+V_1$, $-V_1$ or $-V_2$, as shown in FIG. 11. The pre integration signal $V_a$ is sent through a first output 286 provided on the decoder controller 261 to an input 288 of a limiter integrator 290 having an output 292 through which an output signal $V_a$ is produced and sent to the second port 278 of the selector 268, which signal $V_a$ then exits the selector 268 through its output 271. The signal $V_a$ waveform is illustrated on graph A of FIG. 14, which shows an approximation of a desired modulation signal waveform envelope. Operation details of the limiter integrator 290 digital to analog converter as shown in FIG. 10 will be now explained with reference to FIG. 14 and TABLE I. Prior to the transmission of a bits string corresponding to a given amplitude modulation portion, the values of $B_0$ and $B_1$ are both initially set to "0" values, the decoder/controller 261 accordingly sending to the limiter/integrator 290 a pre integration signal $V_a$ showing negative polarity and a $V_1$ amplitude value, which corresponds to a "$-A_1$" slope amplitude, according to the predetermined values given in TABLE I. As shown in graph A of FIG. 14, the initial waveform amplitude value of the signal $V_a$ at the output 292 of the limiter integrator 290 is set to zero, and since the integration provided thereby is limited to positive range in a such way that $V_a$ is always equal to or greater than zero, the output signal at 292 is kept constant to a zero value. At time $t_0$, a first bit $B_i$ of the phase modulation data bits string having a "0" value is fed to the decoder/controller 261 and the reference clock 264 simultaneously sends a clock signal to the shift register of the decoder/controller for triggering the transfer a "0" value stored in the memory cell 280 into memory cell 284 and storing the corresponding "0" value in the memory cell 280 as $B_0$. Since the values of $B_0$ and $B_1$ are still set to "0", the limiter integrator output signal $V_a$ is accordingly kept to a zero value, as shown at numeral 294. At time $t_1$, the resulting values of $B_0$ and $B_1$ remain unchanged, and the limiter integrator output signal $V_a$ is still kept to a zero value, as shown at numeral 296. At time $t_2$, a following bit $B_i$ having a "1" value is fed to the input 260 of the decoder/controller and the reference clock 264 simultaneously sends a clock signal to the shift register of the decoder/controller for triggering the transfer of a "0" value stored in the memory cell 280 into memory cell 284 and storing the corresponding "1" value in the memory cell 280 as the current value of $B_0$. Then, the decoder/controller 261 accordingly sends to the limiter/integrator 290 a pre integration signal $V_a$ showing positive polarity and $V_1$ amplitude value, which corresponds to a "$+A_1$" slope amplitude, according to the predetermined values given in TABLE I. As shown at numeral 298 in graph A of FIG. 14, the limiter integrator begins to produce an integrated linear waveform amplitude signal characterized by a first slope. At time $t_3$, a following bit $B_i$ of the phase modulation data bits string having a "1" value is fed to the decoder/controller 261 and the reference clock 264 simultaneously sends a clock signal to the shift register of the decoder/controller of the decoder/controller for triggering the transfer of a "1" value stored in the memory cell 280 into the memory cell 284 and storing the corresponding "1" value in the memory cell 280 as the current value of $B_0$. Then, the decoder/controller 261 accordingly sends to the limiter/integrator 290 a pre integration signal $V_a$ showing positive polarity and a $V_2$ amplitude value, which corresponds to a "$+A2$" slope amplitude, according to the predetermined values given in TABLE I. As shown at numeral 300 in graph A of FIG. 14, the limiter integrator continues to produce an integrated linear waveform amplitude signal, but with a higher slope, "$V_2$" being greater than "$V_1$" in a particular instance as shown in graph A of FIG. 14. At time $t_4$, a following bit $B_i$ of the phase modulation data bits string having a "0" value is fed to the decoder/controller 261 and the reference clock 264 simultaneously sends a clock signal to the shift register of the decoder/controller for triggering the transfer of a "1" value stored in the memory cell 280 into the memory cell 284 and storing the corresponding "0" value in the memory cell 280 as $B_0$. Then, the decoder/controller 261 accordingly sends to the limiter/integrator 290 a pre integration signal $V_a$ showing negative polarity and a $V_2$ amplitude value, which corresponds to a "$-A_2$" slope amplitude, according to the predetermined values given in TABLE I. As shown at numeral 302 in graph A of FIG. 14, the limiter integrator reverses the sign of the integration with the same "$A_2$" slope amplitude value to produce an integrated waveform amplitude signal characterized by a linearly decreasing waveform amplitude. Time $t_4$ is accordingly associated with a maximum waveform amplitude signal $V_c$, as shown at numeral 301, and accurately corresponds to an MLS beam as shown in FIG. 2, in this particular instance. At time $t_5$, a following bit $B_i$ of the phase modulation data bits string having a "0" value is fed to the decoder/controller 261 and the reference clock 264 simultaneously sends a clock signal to the shift register of the decoder/controller for triggering the transfer of a "0" value stored in the memory cell 280 into the memory cell 284 and storing the corresponding "0" value in the memory cell 280 as $B_0$. Then, the decoder/controller 261 accordingly sends to the limiter/integrator 290 a pre integration signal $V_a$ showing negative polarity and a $V_1$ amplitude value, which corresponds to a "$-A_1$" slope amplitude, according to the predetermined values given in TABLE I. As shown at numeral 304 in graph A of FIG. 14, the limiter integrator continues to produce through negative integration a linear waveform amplitude signal, but with a lower slope, until a zero value is reached. At time $t_6$, a following bit $B_i$ of the phase modulation data bits string having a "0" value is fed to the decoder/controller 261 and the reference clock 264 simultaneously sends a clock signal to the shift register of the decoder/controller for triggering the transfer of a "0" value stored in the memory cell 280 into the memory cell 284 and storing the corresponding "0" value in the memory cell 280 as $B_0$. Then, the decoder/controller 261 accordingly sends to the limiter/integrator 290 a pre integration signal $V_a$ showing negative polarity and a $V_1$ amplitude value, which corresponds to a "$-A_1$" slope amplitude, according to the predetermined values given in TABLE I. As shown at numeral 306 in graph A of FIG. 14, the final waveform amplitude value of the signal $V_c$ at the output 292 of the limiter integrator 288 is kept to zero, since the integration provided by the limiter integrator 290 is limited to positive range, as earlier mentioned.

Returning to FIG. 10, the selector output 271 is connected to an input 308 of a first lowpass filter 310, as a well known Bessel lowpass filter having proper bandwidth, which smoothes the output signal $V_c$ or $V_d$, as the case may be, to produce at an output 312 thereof the analog modulation signal which is fed to an input 314 of a voltage to current converter 316 producing a proportional modulation current at an output 318 thereof, so as to properly feed the following modulator, as earlier explained with reference to FIG. 4.

Figure 9A:
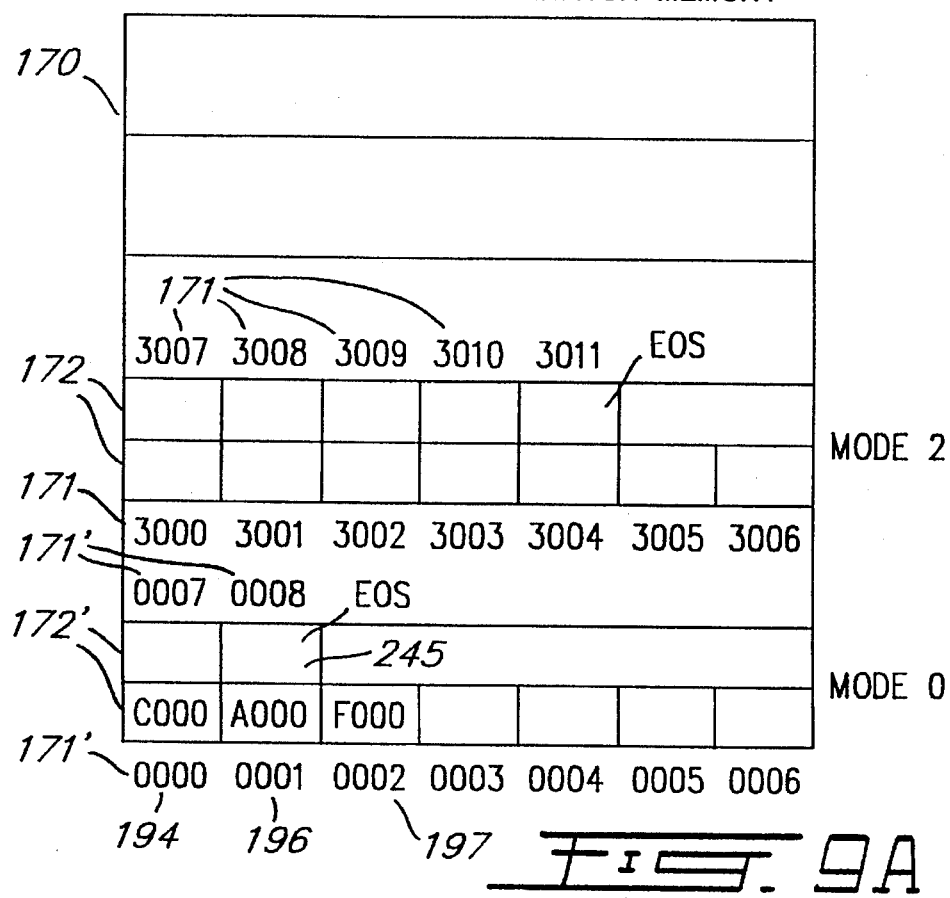
FIG. 9A is a schematic diagram of a function address generator memory provided in the sequencer of the present invention.

Returning now to FIG. 8, there is shown a second digital to analog converter 163 for producing a corresponding carrier frequency signal level analog control signal which is directed toward the variable attenuator 74 input through a line 54, as better shown in FIG. 4. The digital generator of the sequencer comprises a sequence mode selector 162 for selecting from a plurality of modes associated with a plurality of functions sequences, a mode associated with a respective sequence of functions to be provided in said modulation signal. The sequence mode selector 162 sends a signal indicating a selected mode at an output 164 thereof toward an input 166 of a function address generator 168 comprising a memory, as designated at numeral 170 in FIG. 9B, for storing function generally designated at numeral 172 and 172', at respective memory addresses generally designated at numerals 171 and 171' as illustrated in the example as shown in FIG. 9A on which only mode 0 and mode 2 is shown. A respective series of function addresses is associated with each sequence comprised in the plurality of sequences corresponding to the available modes. The function address generator 168 is responsive to the signal indicating a selected mode to produce at a first output 174 thereof a first function address signal associated with a first function corresponding to the selected mode. The digital generator 156 of the sequencer is further provided with a function element address generator 176 having an input 178 connected to the output 174 of the function address generator 168 for receiving a first function address signal associated with the selected mode. The function element address generator 176 produces at a first output 180 thereof a function element address signal associated with at least one function element containing data bits and forming the first function of the current selected mode. The digital generator 156 of the sequencer is further provided with a function memory 181 having an input 182 connected to the first output 180 of the function element address generator for receiving the function element address signal. It is pointed out that although function addresses and modulation information are respectively stored in distinct memory devices 170 and 181 in a particular instance as shown in FIGS. 9A and 9B, a single memory device with proper addressing can be obviously used.

Figure 9B:
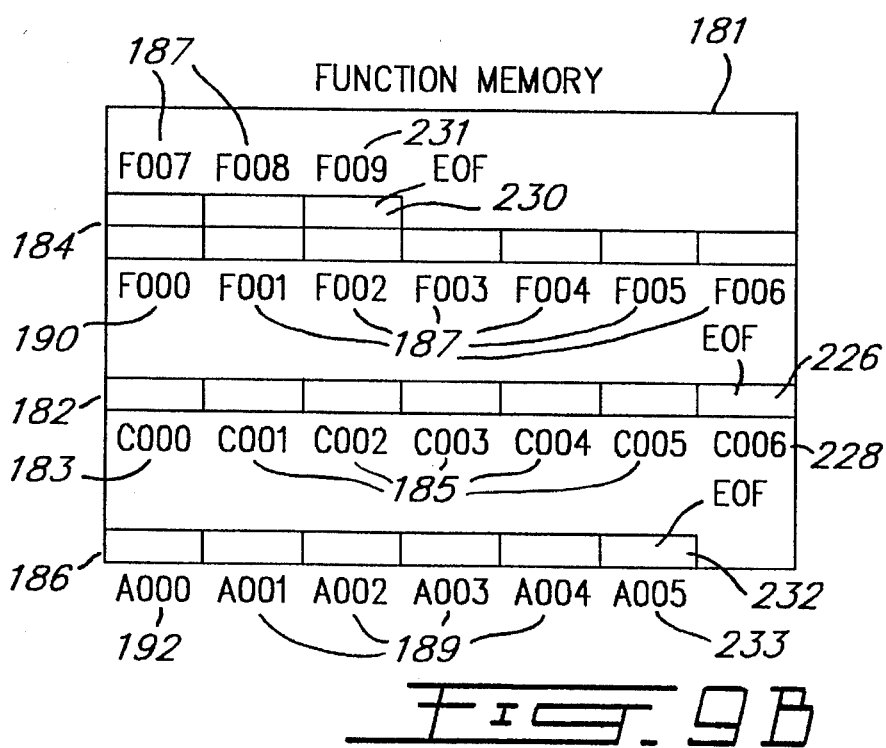
FIG. 9B is a schematic diagram of a function memory provided in the sequencer of the present invention.

As shown in FIG. 9B wherein the function memory data structure is schematically represented, the function memory 181 stores, at a corresponding address 183, modulation information associated with the first element of first function 182 of the selected mode 0, and stores, at additional addresses generally designated at numeral 185, modulation information associated with a plurality of additional elements of this first function. In an example as shown in FIG. 9B, the function memory 181 further stores information associated with additional function elements 187 and 189, respectively associated with a plurality of additional functions 184 and 186. It is pointed out that first function element addresses 183, 190 and 192 respectively associated with each of functions 182, 184 and 186 are stored at addresses 0000, 0001 and 0002 of the function address generator memory 170, with reference to numerals 194, 196 and 197. The modulation information associated with function elements comprises modulation and control data and timing data.

Returning to FIG. 8, the function memory produces at a first output 199 thereof a composite digital modulation signal comprising modulation and control data corresponding to the function element address signal associated with a function element of the first function for the selected mode. The function memory further produces at a second output 200 a timing signal A representing the timing data corresponding to the current function element address signal. The digital generator of the sequencer is further provided with a function timer 202 for producing at an output 203 thereof a timing reference signal B which is fed to a first input 205 of a timing comparator 206 having a second input 208 connected to the second output 200 of the function memory for receiving the timing data signal. The timing comparator 206 then produces a transmission control signal at an output 209 thereof whenever the timing data signal value equals the timing reference signal value. The digital generator further comprises a buffer 210 having a first input 211 connected to an output 199 of the function memory to receive and store the composite digital modulation signal, and having a second input 213 connected to the output 209 of the timing comparator through lines 214 and 215, to receive the transmission control signal therefrom. The buffer 210 has a driver 216 provided with a digital modulation signal output 218 and a first control output 219 connected to the multiplier of the carrier frequency signal generator through line 34, and with a second control output signal 220 connected to the harmonic generator multiplier of the carrier frequency signal generator through line 52, as shown in FIG. 4. The buffer driver 216 is responsive to the transmission control signal to transmit a digital modulation signal comprising modulation data through the digital modulation signal output 158 and to transmit controls signals for the carrier frequency signal generator through control outputs 219 and 220. The function element address generator 176 has a second input 224 connected to the output 209 of the timing comparator through lines 214 and 225 for receiving the transmission control signal, causing the function element address generator to increment the function address element signal, whereby to produce at the output 180 the function element address generator a function next element address to be transmitted to the function memory whenever data corresponding to this function next element address differs from an end of function code.

Returning to FIG. 9B, data 226 represents the end of function code and corresponds to a last element address 228 of the first function 182, which data 226 is stored at a corresponding address C006. Similarly, functions 184 and 186 comprise respective end of function codes data 230 and 232, which are respectively stored at addresses F009 and A005 designated at numerals 231 and 233 in FIG. 9B.

Returning to FIG. 8, the function element address generator produces an end of function signal at a second output 235 thereof whenever the data corresponding to the current function next element address corresponds to the end of function code. The second output 235 is connected to a first input 237 of the function timer 202 for resetting thereof. The digital generator of the sequencer further comprises a function sequence counter 238 having a first input 239 connected to the second output 235 of the function element address generator for receiving the end of function signal, causing the function sequence counter 238 to be incremented and to produce at an output 240 thereof a next function control signal to a second input 241 of the function address generator 168, causing the latter to produce at the first output 174 thereof a next function address signal associated with a next function to be transmitted for the corresponding selected mode whenever this said next function address differs from an end of sequence code. The function element address generator accordingly produces at the first output 180 thereof a function element address signal associated with a function element forming this next function of the selected mode whenever data corresponding to the function next element address differs from an end of function code. The function memory accordingly produces at first output 199 thereof a composite digital modulation signal comprising modulation and control data corresponding to the function element address signal associated with the current function element, thereby causing the driver 216 to transmit a corresponding digital modulation signal containing modulation data through digital modulation signal output 218, and causing the driver 216 to transmit corresponding control signals for said carrier frequency signal generator through first and second control outputs 219 and 220. The function address generator 168 further produces an end of sequence signal at a second output 243 thereof whenever the next function corresponds to the end of sequence code, as shown at numeral 245 in FIG. 9A. The second output 243 of function address generator 168 is connected to a second input 247 of the function sequence counter 238 for resetting thereof after completion of the transmission of a last function of the current function sequence corresponding to the selected mode. The digital generator of the sequencer is further provided with a reference clock signal generator 248 having an output 249 sending a reference clock signal respectively to a second input 250 of function timer 202 through a line 251, to a third input 253 of the function sequence counter 238 through line 254 and to a third input 256 of function element address generator 176 through line 257. As earlier explained with reference to FIG. 4, the reference clock signal generator 248 could receive from the output 71 of oscillator 72 a basic clock reference signal through a connecting line (not shown). Alternatively, according to the example as shown in FIG. 8, the reference clock generator 248 could be provided with an integrated oscillator (not shown) producing the required basic clock reference signal. A modulation signal is fed to an input 48 provided on the modulator 46 through a line 36.

The transmission of a modulation signal according to a mode 2 as shown in FIG. 9A could be carried out in a same manner as hereabove explained with reference to a mode 0.

It is within the ambit of the present invention to cover any obvious modifications in the proposed system and method, and any carrier frequency modulating applications thereof, provided such modifications and applications fall within the scope of the appended claims.

We claim:

1. A carrier frequency modulating system comprising:

a carrier frequency signal generator for producing a carrier frequency signal at a carrier frequency at an output thereof;

a sequencer for producing a modulation signal at an output thereof, said modulation signal comprising a plurality of modulation signal portions separated by at least one null modulation signal portion having a corresponding null time length;

a modulator for producing a modulated carrier frequency signal at an output thereof, said modulator having a first input connected to the output of said carrier frequency signal generator for receiving said carrier frequency signal, and having a second input for receiving said modulation signal;

a power supply means for supplying electrical power to said carrier frequency signal generator; antenna means having an input connected to the output of said modulator to transmit said modulated carrier frequency signal wherein:

(a) said sequencer is connected to said carrier frequency generator for controlling the activation thereof during the modulation signal portions of the modulation signal to provide the carrier frequency signal to the modulator first input during such portions, and to interrupt delivery of said carrier frequency signal to the modulator during said corresponding null time length; and b) said carrier frequency signal generator comprises:
  (i) an oscillator for producing a first signal at a first frequency at an output thereof;
  (ii) a harmonic generator having an input connected to the output of said oscillator to produce a second signal comprising a plurality of harmonic frequencies at an output thereof, said harmonic frequencies being higher than said first frequency;
  (iv) a bandpass filter means having an input connected to the output of said harmonic generator to select a substantially narrow frequency band centered at a single harmonic frequency from said harmonic frequency signal at said carrier frequency at an output thereof;

said sequencer being connected to said oscillator and said harmonic generator for controlling the activation thereof.

2. A carrier frequency modulating system as claimed in claim 1, wherein said carrier frequency signal generator comprises:

an oscillator for producing a first signal at a first frequency at an output thereof;

signal frequency multiplying means having an input connected to the output of said oscillator to produce a second signal at a second frequency at an output thereof, said second frequency being higher than said first frequency;

a harmonic generator having an input connected to the output of said frequency multiplying means to produce a third signal comprising a plurality of harmonic frequencies at an output thereof, said harmonic frequencies being higher than said second frequency;

a bandpass filter means having an input connected to the output of said harmonic generator to select a substantially narrow frequency band centered at a single harmonic frequency from said harmonic frequencies thereby producing a corresponding carrier frequency signal at said carrier frequency at an output thereof;

wherein said sequencer is connected to said frequency multiplying means and said harmonic generator for controlling the activation thereof.

3. A carrier frequency modulating system as claimed in claim 1 or 2, further comprising second bandpass filter means having an input connected to the output of said modulator to attenuate frequencies adjacent said carrier frequency thereby producing a single frequency modulated carrier frequency signal.

4. A carrier frequency modulating system as claimed in claim 1, further comprising a variable attenuator having an input connected to the output of said modulator for coupling said modulator output to said antenna means, said sequencer being connected to said variable attenuator for controlling the output level of said modulated carrier frequency signal at an output provided on said variable attenuator.

5. A carrier frequency modulating system as claim in claim 4, wherein said sequencer comprises a digital to analog converter, said sequencer being connected to said variable attenuator through said digital to analog converter.

6. A carrier frequency modulating system as claimed in claim 1 or 2, wherein said bandpass filter means comprises a bandpass filter and a lowpass filter connected in series with said bandpass filter, said lowpass filter having a cutoff frequency higher than said single harmonic frequency and being in a range near said single frequency;

whereby said carrier frequency signal is substantially free of interference harmonic frequencies generated by said bandpass filter.

7. A carrier frequency modulating system as claimed in claim 2, wherein said frequency multiplying means comprises at least one frequency multiplier and a bandpass filter connected in series with said at least one frequency multiplier, said bandpass filter having a bandwidth substantially centered on said second frequency.

8. A carrier frequency modulating system as claim in claim 1 or 2, wherein said harmonic generator comprises a clipping amplifier connected to an impedance matching circuit to produce an amplified signal at an output thereof, and a step recovery diode having a terminal connected to the output of said impedance matching circuit, whereby said amplified signal drives said step recovery diode for producing said third signal.

9. A carrier frequency modulating system as claimed in claim 1, wherein at least one of said modulation signal portions comprises at least one phase modulation signal section.

10. A carrier frequency modulating system as claimed in claim 1, wherein at least one of said modulation signal portions comprises at least one amplitude modulation signal section.

11. A carrier frequency modulating system as claimed in claim 1, wherein at least one of said modulation signal portions comprises at least one phase modulation signal section and at least one of said modulation signal portions comprises at least one amplitude modulation signal section, said modulated carrier frequency signal comprising respectively at least one phase modulated carrier frequency signal and at least one amplitude modulated carrier frequency signal.

12. A carrier frequency modulating system as claimed in claim 9 or 11, wherein said first input of said modulator is connected at a first connecting node to respective inputs of first and second conducting paths having a difference in length substantially equal to half a wavelength corresponding to said carrier frequency, said conducting paths having respective outputs being connected to the output of said modulator at a second connecting node, said modulator further comprising a switching means connected to said input for receiving said modulation signal, said switching means being connected to said conducting paths to successively activate only one of said conducting paths at a time, whereby to produce said phase modulated carrier frequency portion of said modulated carrier frequency.

13. A carrier frequency modulating system as claimed in claim 14, wherein each of said conducting paths comprises first and second portion connected respectively by third and fourth nodes which are spaced from said first node by a distance substantially equal to half a wavelength corresponding to said carrier frequency, the second portion of said first conducting path having a length separating said third node from said second node by a distance substantially equal to three quarter a wavelength corresponding to said carrier frequency, the second portion of said second conducting path having a length separating said fourth node from said second node by a distance substantially equal to half a wavelength corresponding to said carrier frequency, whereby to provide said half a wavelength difference in length of said conducting paths, said switching means being connected to said first and second conducting paths respectively at said third and fourth nodes.

14. A carrier frequency modulating system as claimed in claim 13, wherein said switching means comprises first and second diodes having opposed polarity terminals being connected to said input for receiving said modulation signal and being connected to a ground of said system, each terminal of a second pair of opposed polarity terminals being respectively connected to said third and fourth connecting nodes, whereby said carrier frequency signal traverses said first conducting path whenever said second diode is caused to conduct by said modulation signal, said carrier frequency signal traversing said second conducting path whenever said first diode is caused to conduct by said modulation signal.

15. A carrier frequency modulating system as claimed in claim 1 or 2, wherein said sequencer comprises a digital generator for producing a digital modulation signal and control signals for said carrier frequency signal generator, said sequencer further comprising a digital to analog converter receiving said digital modulation signal for producing said modulation signal.

16. A carrier frequency modulating system as claimed in claim 15, wherein said digital to analog converter is provided with a voltage to current converting means coupled to to produce said modulation signal.

17. A carrier frequency modulating system as claimed in claim 16, wherein said digital modulation signal comprises a delta modulation signal portion, said digital to analog converter comprising:

means for generating a reference clock signal; means for decoding said digital modulation, said decoding means comprising a shift register for successively storing a sample of said digital modulation upon receipt of said reference clock signal, whenever said decoding means has detected sampling actuation data comprised in said digital modulation signal, said decoder producing at a first output thereof a pre integration signal whose characteristics are determined according to a predetermined code represented by said sample;

integrating means having an input receiving said pre integration signal for integration thereof, said integrating means producing an integrated amplitude signal at an output thereof, said integrating means limiting said integrated amplitude signal to a null or positive value;

first lowpass filter means receiving said integrated amplitude signal and coupled to an input provided on said voltage to current converting means.

18. A carrier frequency modulating system as claimed in claim 17, wherein said digital to analog converter further comprises:

port selector means having a control input and an output, said decoding means having a second output for sending a port selection control signal to said control input of said port selector means, and a third output for producing an alternate modulation analog signal, said port selector means further having a first input port for receiving said alternate modulation analog signal and a second input port coupled to said integrating means output;

said port selector means connecting said first input port to said selector output whenever said decoding means has detected alternate modulation actuation data comprised in said digital modulation signal and has sent a corresponding selection control signal to said port selector means, said port selector means output thereby sending said integrated amplitude signal to said first lowpass filter means;

said port selector means connecting said second input port to said selector output whenever said decoding means has detected sampling actuation data comprised in said digital modulation signal and has sent a corresponding selection control signal to said selector means, said port selector means output thereby sending said alternate modulation analog signal to said first lowpass filter means.

19. A carrier frequency modulating system as claimed in claim 18, wherein said alternate modulation is a phase modulation.

20. A carrier frequency modulating system as claimed in claim 19, wherein said digital to analog converter further comprises:

a second lowpass filter means coupled to said decoding means third output for filtering said alternate modulation analog signal prior to feeding said selector first input port.

21. A carrier frequency modulating system as claimed in claim 10, wherein said sequencer causes the amplitude of said amplitude modulation signal to vary in successive increasing or decreasing predetermined steps separated by predetermined time periods, whereby said modulator produces an amplitude modulated carrier frequency signal having a corresponding predetermined envelope.

22. A carrier frequency modulating system as claimed in claim 1 or 2, wherein at least one of said modulation signal portions comprises at least one amplitude modulation signal section, and wherein said sequencer causes the amplitude of said amplitude modulation signal to vary in successive increasing or decreasing predetermined steps separated by predetermined time periods, whereby said modulator produces an amplitude modulated carrier frequency signal having a corresponding predetermined envelope.

23. A carrier frequency modulating system as claimed in claim 22, wherein said sequencer causes said harmonic generator to be successively activated before an amplitude modulation period and deactivated after said amplitude modulation period, said at least a portion of said amplitude modulation signal being produced while said harmonic generator is activated during said amplitude modulation period.

24. A carrier frequency modulating system as claimed in claim 1, wherein said sequencer further comprises:

a sequence mode selector for selecting from a plurality of modes associated with a plurality of functions sequences a mode associated with a respective sequence of functions to be provided in said modulation signal, said sequence mode selector sending a signal indicating said selected mode at an output thereof;

a function address generator having an input connected to the output of said sequence mode selector, said function address generator comprising a memory for storing function addresses associated with each sequence of said plurality of sequences corresponding to said plurality of modes, said function address generator being responsive to said signal indicating said selected mode to produce at a first output thereof a first function address signal associated with a first function corresponding to said selected mode;

a function element address generator having an input connected to the first output of said function address generator, said function element address generator receiving said first function address signal associated with said selected mode, said function element address generator producing at a first output thereof a function element address signal associated with at least one function element constituting said first function of said selected mode;

a function memory having an input connected to the first output of said function element address generator for receiving said function element address signal, said function memory storing at corresponding addresses modulation information associated with said at least one element of said first function, and for storing at corresponding addresses information associated with at least one additional function element associated with a plurality of additional functions, said modulation information associated with said function elements comprising modulation and control data and timing data, said function memory producing at a first output thereof a composite digital modulation signal comprising modulation and control data corresponding to said function element address signal associated with at least one function element constituting said first function of said selected mode, said function memory producing at a second output a timing signal representing said timing data corresponding to said function element address signal associated with at least one function element constituting said first function of said selected mode;

a function timer for producing at an output thereof a timing reference signal into a first input of a timing comparator having a second input connected to the second output of said function memory for receiving said timing data signal, to produce a transmission control signal at an output thereof whenever the value of said timing data signal equals the value of said timing reference signal;

a buffer having a first input connected to the first output of said function memory to receive and store said composite digital modulation signal comprising modulation and control data corresponding to said function element address signal associated with at least one function element constituting said first function of said selected mode, said buffer having a driver provided with a digital modulation signal output and a first control output means connected to said carrier frequency signal generator, said buffer has a second input connected to the output of said timing comparator for receiving said transmission control signal, whereby to cause said driver to transmit a digital modulation signal comprising modulation data through said digital modulation signal output and to cause said driver to transmit control signal for said carrier frequency signal generator through said first control output means;

wherein said function element address generator has a second input connected to the output of said timing comparator for receiving said transmission control signal, to cause said function element address generator to increment said function address element signal whereby to produce at the output of said function element address generator a function next element address to be transmitted to said function memory whenever data corresponding to said function next element address differs from an end of function code, said function element address generator means producing an end of function signal at a second output thereof whenever said data corresponding to said function next element address corresponds to said end of function code, said second output being connected to a first input provided on said function timer for resetting said function timer;

said system further comprising a function sequence counter having a first input connected to the second output of said function element address generator for receiving said end of function signal, to cause said function sequence counter to be incremented and to produce at an output thereof a next function control signal to a second input provided on said function address generator, causing said function address generator to produce at said first output thereof a next function address signal associated with a next function to be transmitted for the corresponding selected mode whenever said next function address differs from an end of sequence code, thereby causing said function element address generator to produce at said first output thereof a function element address signal associated with at least one function element constituting said next function of said selected mode whenever data corresponding to said function next element address differs from said end of function code, thereby causing said function memory to produce at said first output thereof a composite digital modulation signal comprising modulation and control data corresponding to said function element address signal associated with at least one function element constituting said next function of said selected mode, thereby causing said driver to transmit a corresponding digital modulation signal containing modulation data through said digital modulation signal output and to cause said driver to transmit corresponding control signal for said carrier frequency signal generator through said first control output means, said function address generator producing an end of sequence signal at a second output thereof whenever said next function corresponds to said end of sequence code, said second output being connected to a second input provided on said function sequence counter for resetting said sequence counter after completion of the transmission of a last function of said function sequence corresponding to said selected mode;

a reference clock signal generating means having an output sending a reference clock signal respectively to a second input provided on said function timer, to a third input provided on said function sequence counter and to a third input provided on said function element address generator.

25. A carrier frequency modulating system as claimed in claim 1, wherein said sequencer further comprises:

a sequence mode selector for selecting from a plurality of modes associated with a plurality of function sequences a mode associated with a respective sequence of functions to be provided in said modulation signal, said sequence mode selector sending a signal indicating said selected mode at an output thereof;

a function address generator having an input connected to the output of said sequence mode selector, said function address generator comprising a memory for storing function addresses associated with each sequence of said plurality of sequences corresponding to said plurality of modes, said function address generator being responsive to said signal indicating said selected mode to produce at a first output thereof a first function address signal associated with a first function corresponding to said selected mode;

a function element address generator having an input connected to the first output of said function address generator, said function element address generator receiving said first function address signal associated with said selected mode, said element function address generator producing at a first output thereof a function element address signal associated with at least one function element constituting said first function of said selected mode;

a function memory having an input connected to the first output of said function element address generator for receiving said function element address signal, said function memory storing at corresponding addresses modulation information associated with said at least one element of said first function, and for storing at corresponding addresses information associated with at least one additional function elements associated with a plurality of additional functions, said modulation information associated with said function elements comprising modulation and control data and timing data, said function memory producing at a first output thereof a composite digital modulation signal comprising modulation and control data corresponding to said function element address signal associated with at least one function element constituting said first function of said selected mode, said function memory producing at a second output a timing signal representing said timing data corresponding to said function element address signal associated with at least one function element constituting said first function of said selected mode;

a function timer for producing at an output thereof a timing reference signal into a first input of a timing comparator having a second input connected to the second output of said function memory for receiving said timing data signal, to produce a transmission control signal at an output thereof whenever the valve of said timing data signal equals the valve of said timing reference signal;

a buffer having a first input connected to the first output of said function memory to receive and store said composite digital modulation signal comprising modulation and control data corresponding to said function element address signal associated with at least one function element constituting said first function of said selected mode, said buffer having a driver provided with a digital modulation signal output and first and second control outputs respectively connected to said frequency multiplying means and harmonic generator, said buffer has a second input connected to the output of said timing comparator for receiving said transmission control signal, whereby to cause said driver to transmit a digital modulation signal comprising modulation data through said digital modulation signal output and to cause said driver to transmit control signals for said frequency multiplying means and harmonic generator respectively through said first and second control outputs;

wherein said function element address generator has a second input connected to the output of said timing comparator for receiving said transmission control signal, to cause said function element address generator to increment said function address element signal whereby to produce at the output of said function element address generator a function next element address to be transmitted to said function memory whenever data corresponding to said function next element address differs from an end of function code, said function element address generator means producing an end of function signal at a second output thereof whenever said data corresponding to said function next element address corresponds to said end of function code, said second output being connected to a first input provided on said function timer for resetting said function timer;

said system further comprising a function sequence counter having a first input connected to the second output of said function element address generator for receiving said end of function signal, to cause said function sequence counter to be incremented and to produce at an output thereof a next function control signal to a second input provided on said function address generator, causing said function address generator to produce at said first output thereof a next function address signal associated with a next function to be transmitted for the corresponding selected mode whenever said next function address differs from an end of sequence code, thereby causing said function element address generator to produce at said first output thereof a function element address signal associated with at least one function element constituting said next function of said selected mode whenever data corresponding to said function next element address differs from an end of function code provided at the end of said next function, thereby causing said function memory to produce at said first output thereof a composite digital modulation signal comprising modulation and control data corresponding to said function element address signal associated with at least one function element constituting said next function of said selected mode, thereby causing said driver to transmit a corresponding digital modulation signal containing modulation data through said digital modulation signal output and to cause said driver to transmit corresponding control signals for said frequency multiplying means and harmonic generator respectively through said first and second control outputs, said function address generator producing an end of sequence signal at a second output thereof whenever said next function corresponds to said end of sequence code, said second output being connected to a second input provided on said function sequence counter for resetting said sequence counter after completion of the transmission of a last function of said function sequence corresponding to said selected mode;

a reference clock signal generating means having an output sending a reference clock signal respectively to a second input provided on said function timer, to a third input provided on said function sequence counter and to a third input provided on said function element address generator.

26. A carrier frequency modulating system as claimed in claim 2, wherein said sequencer further comprises:

a sequence mode selector for selecting from a plurality of modes associated with a plurality of function sequences a mode associated with a respective sequence of functions to be provided in said modulation signal, said sequence mode selector sending a signal indicating said selected mode at an output thereof;

a function address generator having an input connected to the output of said sequence mode selector, said function address generator comprising a memory for storing function addresses associated with each sequence of said plurality of sequences corresponding to said plurality of modes, said function address generator being responsive to said signal indicating said selected mode to produce at a first output thereof a first function address signal associated with a first function corresponding to said selected mode;

a function element address generator having an input connected to the first output of said function address generator, said function element address generator receiving said first function address signal associated with said selected mode, said function element address generator producing at a first output thereof a function element address signal associated with at least one function element constituting said first function of said selected mode;

a function memory having an input connected to the first output of said function element address generator for receiving said function element address signal, said function memory storing at corresponding addresses modulation information associated with said at least one element of said first function, and for storing at corresponding addresses information associated with at least one additional function elements associated with a plurality of additional functions, said modulation information associated with said function elements comprising modulation and control data and timing data, said function memory producing at a first output thereof a composite digital modulation signal comprising modulation and control data corresponding to said function element address signal associated with at least one function element constituting said first function of said selected mode, said function memory producing at a second output a timing signal representing said timing data corresponding to said function element address signal associated with at least one function element constituting said first function of said selected mode;

a function timer for producing at an output thereof a timing reference signal into a first input of a timing comparator having a second input connected to the second output of said function memory for receiving said timing data signal, to produce a transmission control signal at an output thereof whenever the valve of said timing data signal equals the valve of said timing reference signal;

a buffer having a first input connected to the first output of said function memory to receive and store said composite digital modulation signal comprising modulation and control data corresponding to said function element address signal associated with at least one function element constituting said first function of said selected mode, said buffer having a driver provided with a digital modulation signal output and first and second control outputs respectively connected to said oscillator and harmonic generator, said buffer has a second input connected to the output of said timing comparator for receiving said transmission control signal, whereby to cause said driver to transmit a digital modulation signal comprising modulation data through said digital modulation signal output and to cause said driver to transmit control signals for said oscillator and harmonic generator respectively through said first and second control outputs;

wherein said function element address generator has a second input connected to the output of said timing comparator for receiving said transmission control signal, to cause said function element address generator to increment said function address element signal whereby to produce at the output of said function element address generator a function next element address to be transmitted to said function memory whenever data corresponding to said function next element address differs from an end of function code, said function element address generator means producing an end of function signal at a second output thereof whenever said data corresponding to said function next element address corresponds to said end of function code, said second output being connected to a first input provided on said function timer for resetting said function timer;

said system further comprising a function sequence counter having a first input connected to the second output of said function element address generator for receiving said end of function signal, to cause said function sequence counter to be incremented and to produce at an output thereof a next function control signal to a second input provided on said function address generator, causing said function address generator to produce at said first output thereof a next function address signal associated with a next function to be transmitted for the corresponding selected mode whenever said next function address differs from an end of sequence code, thereby causing said function element address generator to produce at said first output thereof a function element address signal associated with at least one function element constituting said next function of said selected mode whenever data corresponding to said function next element address differs from an end of function code, thereby causing said function memory to produce at said first output thereof a composite digital modulation signal comprising modulation and control data corresponding to said function element address signal associated with at least one function element constituting said next function of said selected mode, thereby causing said driver to transmit a corresponding digital modulation signal containing modulation data through said digital modulation signal output and to cause said driver to transmit corresponding control signals for said oscillator and harmonic generator respectively through said first and second control outputs, said function address generator producing an end of sequence signal at a second output thereof whenever said next function corresponds to said end of sequence, said second output being connected to a second input provided on said function sequence counter for resetting said sequence counter after completion of the transmission of a last function of said function sequence corresponding to said selected mode;

a reference clock signal generating means having an output sending a reference clock signal respectively to a second input provided on said function timer, to a third input provided on said function sequence counter and to a third input provided on said function element address generator.

27. A carrier frequency modulation system as claimed in claim 24 or 25 or 26, wherein said sequencer further comprises a digital to analog converter receiving said digital modulating signals for producing corresponding modulation signals.

28. A carrier frequency modulating system as claimed in claim 24 or 25 or 26, further comprising a second bandpass filter means having an input connected to the output of said modulator to attenuate frequencies adjacent said carrier frequency thereby producing a single frequency modulated carrier frequency signal.

29. A carrier frequency modulating system as claimed in claims 24, further comprising antenna means coupled to the output of said modulator, to transmit said modulated carrier frequency signal.

30. A carrier frequency modulating system as claimed in claim 29, wherein said modulation information associated with said function elements further comprises modulated signal level control data, and said composite digital modulation signals further comprise said modulated signal level control data, said system further comprising a variable attenuator having a first input connected to the output of said modulator for coupling said modulator output to said antenna means and a second output coupled to a second control output means provided on said buffer, said buffer producing at said second control output means thereof corresponding modulated signal level digital control signals for said variable attenuator.

31. A carrier frequency modulating system as claimed in claim 25 or 26, wherein said modulation information associated with said function elements further comprise modulated signal level control data and said composite digital modulation signals further comprise said modulated signal level control data, said system further comprising a variable attenuator having a first input connected to the output of said modulator for coupling said modulator output to said antenna means and a second input coupled to a third control output provided on said buffer, said buffer producing at said third control output thereof corresponding modulated signal level digital control signals for said variable attenuator.

32. A carrier frequency modulating system as claimed in claim 29, wherein said system is a microwave landing system receiver testing system, said modulation signal comprises at least one phase modulation signal portion and at least one amplitude modulation signal portion, said modulated carrier frequency signal comprising respectively at least one phase modulated carrier frequency portion and at least one amplitude modulated carrier frequency portion.

33. A carrier frequency modulating system as claimed in claim 24 or 25 or 26, wherein said reference clock signal means has an input connected to the output of said oscillator.

34. A carrier frequency modulating system as claimed in claim 25 or 26, wherein said modulation information associated with said function elements further comprises modulated signal level control data, said composite digital modulation signals further comprising said modulated signal level control data, said buffer producing at a third control output thereof corresponding modulated signal level digital control signals for said variable attenuator, said sequencer further comprising a digital to analog converter receiving said modulated signal level digital control signals for producing corresponding modulated signal level control signals.

35. A carrier frequency modulating system as claimed in claim 24 or 25 or 26, wherein said system is a microwave landing system receiver testing system, said modulating signal comprising at least one phase modulation signal portion and at least one amplitude modulation signal portion, said modulated carrier frequency signal comprising respectively at least one phase modulated carrier frequency portion and at least one amplitude modulated carrier frequency portion.

36. A carrier frequency modulating system as claimed in claims 25 or 26, further comprising antenna means coupled to the output of said modulator, to transmit said modulated carrier frequency signal.

37. A carrier frequency modulating system as claimed in claim 30, wherein said sequencer further comprises a digital to analog converter coupling said variable attenuator second input to said buffer second control output, said digital to analog converter producing corresponding modulated signal level analog control signals for said variable attenuator.

38. A carrier frequency modulating system as claimed in claim 31, wherein said sequencer further comprises a digital to analog converter coupling said variable attenuator second input to said buffer third control output, said digital to analog converter producing corresponding modulated signal level analog control signals for said variable attenuator.

39. A carrier frequency modulating system as claimed in claim 36, wherein said system is a microwave landing system receiver testing system, said modulation signal comprising at least one phase modulation signal portion and at least one amplitude modulating signal portion, said modulated carrier frequency signal comprising respectively at least one phase modulated carrier portion and at least one amplitude modulated carrier frequency portion.

40. A carrier frequency modulating system as claimed in claim 38, wherein said system is a microwave landing system receiver testing system, said modulation signal comprising at least one phase modulation signal portion and at least one amplitude modulation signal portion, said modulated carrier frequency signal comprising respectively at least one phase modulated carrier frequency portion.

41. A method of modulating a carrier frequency comprising the steps of:

i) producing a carrier frequency signal;

ii) producing a modulation signal comprising a plurality of modulation signal portions separated by at least one null modulation signal portion having a corresponding null time length;

iii) modulating said carrier frequency signal according to said plurality of modulation signal portions;

iv) interrupting said production of the carrier frequency signal during said corresponding null time length when a null modulation signal portion is present in the modulation signal; and v) transmitting said modulating signal through an antenna and wherein said carrier frequency signal is provided by the steps of:

a) producing a first signal at a first frequency;

b) multiplying said first signal to produce a second signal at a second frequency said second frequency being higher than said first frequency;

c) using said second signal to produce a third signal comprising a plurality of harmonic frequencies, said harmonic frequencies being higher than said second frequency; and d) filtering said harmonic frequencies to select a substantially narrow frequency band centered at a single harmonic frequency from said harmonic frequencies thereby producing a corresponding carrier frequency signal.

42. A method for modulating a carrier frequency as claimed in claim 41, further comprising the steps of:

v) filtering said carrier frequency signal for attenuating frequencies adjacent said single harmonic frequency thereby producing a single frequency modulated carrier frequency signal.

* * * * *